(12) United States Patent
Spears et al.

(10) Patent No.: US 8,072,271 B1
(45) Date of Patent: Dec. 6, 2011

(54) TERMINATION CIRCUIT BASED LINEAR HIGH EFFICIENCY RADIO FREQUENCY AMPLIFIER

(75) Inventors: Edward T. Spears, Oak Ridge, NC (US); Jason Stutzman, Belews Creek, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 12/579,117

(22) Filed: Oct. 14, 2009

Related U.S. Application Data

(60) Provisional application No. 61/105,231, filed on Oct. 14, 2008.

(51) Int. Cl.
*H03F 3/191* (2006.01)
(52) U.S. Cl. ...................................................... 330/302
(58) Field of Classification Search .................. 330/149, 330/302
See application file for complete search history.

(56) References Cited

U.S. PATENT DOCUMENTS

| | | | |
|---|---|---|---|
| 5,629,648 A | 5/1997 | Pratt | |
| 6,043,707 A | 3/2000 | Budnik | |
| 6,130,579 A | 10/2000 | Iyer et al. | |
| 6,313,705 B1 | 11/2001 | Dening et al. | |
| 6,377,784 B2 | 4/2002 | McCune | |
| 6,750,721 B2 | 6/2004 | Patterson | |
| 7,307,473 B2 * | 12/2007 | Kusunoki et al. | 330/149 |

OTHER PUBLICATIONS

Kim, Ell-Kou et al., "A Series Feedback Predistorter using Junction Resistance of Schottky Diode," Proceedings of Asia-Pacific Microwave Conference, 2007, pp. 1-4, IEEE.
Staudinger, Joseph, "The Importance of Sub-Harmonic Frequency Terminations in Modeling Spectral Regrowth From CW Am-Am & Am-Pm Derived Non-Linearities," 1997 Wireless Communications Conference, 1997, pp. 121-125, IEEE.
Vuolevi, Joel et al., "Measurement Technique for Increasing the Linearity by Optimising the Source Impedance of RF Power Amplifiers," Radio and Wireless Conference, 2000, pp. 227-230, IEEE.
Yamada, Hiroshi et al., "Self-Linearizing Technique for L-Band HBT Power Amplifier: Effect of Source Impedance on Phase Distortion," IEEE Transactions on Microwave Theory and Techniques, Dec. 1996, pp. 2398-2402, vol. 44, No. 12, IEEE.

* cited by examiner

*Primary Examiner* — Steven J Mottola
(74) *Attorney, Agent, or Firm* — Withrow & Terranova, P.L.L.C.

(57) ABSTRACT

The present disclosure relates to RF power amplifier circuitry that may include a source termination circuit, a load termination circuit, or both used in an unconventional manner to shape amplitude-based amplitude modulation (AM-AM) distortion, amplitude-based phase modulation (AM-PM) distortion, or both to extend a linear operating range of the RF power amplifier circuitry. Conventional RF power amplifier circuitry may operate as a Class F RF power amplifier, which may use termination circuits to create impedance valleys at even harmonics of an RF carrier frequency to improve a saturated efficiency of the RF power amplifier circuitry. However, the termination circuits of the present disclosure may create impedance valleys that are not at even harmonics of an RF carrier frequency to shape amplitude-based distortion, thereby extending a linear operating range of the RF power amplifier circuitry.

21 Claims, 24 Drawing Sheets

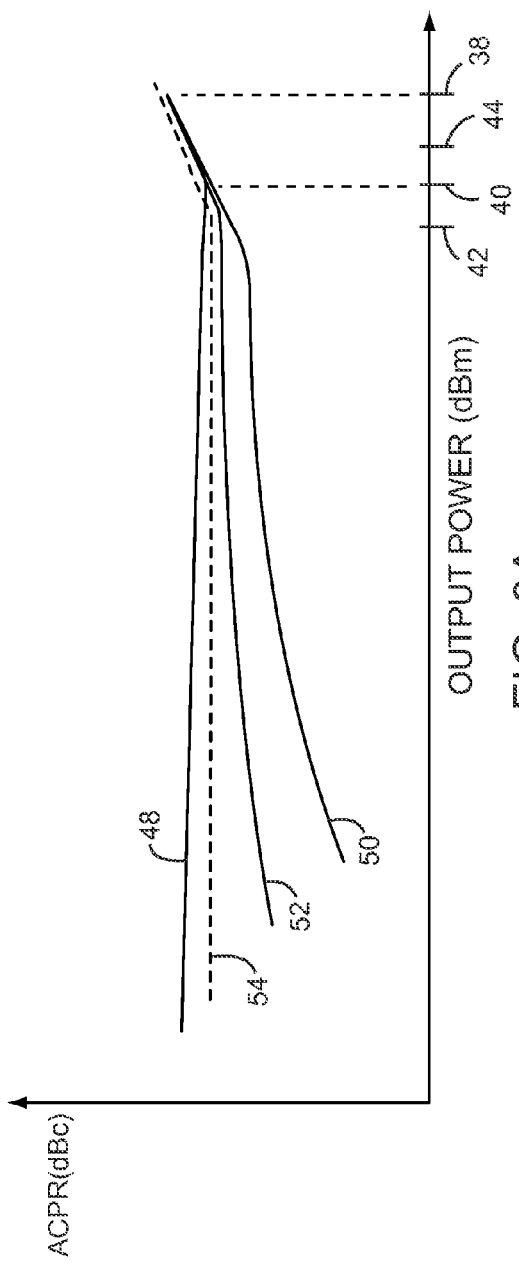
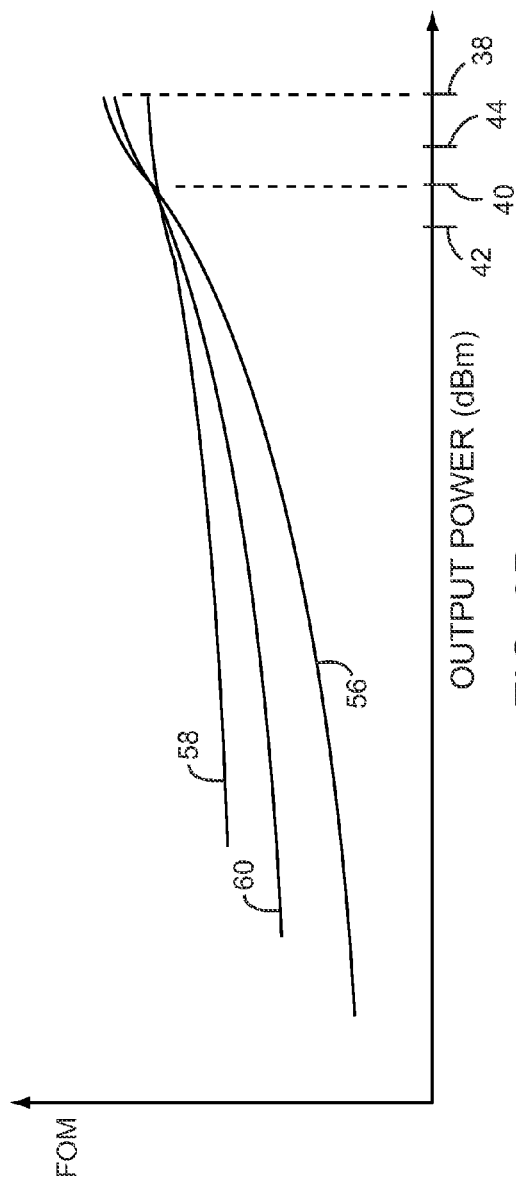
FIG. 8A
FIG. 8B ated in FIG. 6.
TERMINATION CIRCUIT BASED LINEAR HIGH EFFICIENCY RADIO FREQUENCY AMPLIFIER This application claims the benefit of provisional patent application Ser. No. 61/105,231, filed Oct. 14, 2008, the disclosure of which is hereby incorporated herein by reference in its entirety.

RELATED APPLICATIONS

This application is related to U.S. patent application Ser. No. 12/579,099 entitled BIAS-BASED LINEAR HIGH EFFICIENCY RADIO FREQUENCY AMPLIFIER filed Oct. 14, 2009, which is concurrently filed herewith and incorporated herein by reference in its entirety.

FIELD OF THE DISCLOSURE

Embodiments of the present disclosure relate to radio frequency (RF) amplifiers, which may be used in RF communications circuits.

BACKGROUND OF THE DISCLOSURE

As wireless technology progresses, communications devices are becoming increasingly integrated and sophisticated. For example, smart phones are small, portable, battery-powered wireless communications devices that may support numerous applications and wireless communications protocols. Support of such features may increase power consumption; however, market forces tend to drive down size and weight of portable wireless communications devices, thereby leading to reduced battery size, weight, or both, thereby reducing battery capacity. Further, advanced wireless communications protocols may have stringent linearity and out-of-band emissions requirements. The combination of increased power consumption and a desire to reduce battery size and weight drives a need to improve operating efficiency, while meeting stringent requirements mandated by advanced wireless communications protocols. Thus, there is a need to improve operating efficiency of wireless communications devices while conforming to requirements mandated by advanced wireless communications protocols.

SUMMARY OF THE EMBODIMENTS

The present disclosure relates to RF power amplifier circuitry that may include a source termination circuit, a load termination circuit, or both used in an unconventional manner to shape amplitude-based amplitude modulation (AM-AM) distortion, amplitude-based phase modulation (AM-PM) distortion, or both to extend a linear operating range of the RF power amplifier circuitry. Conventional RF power amplifier circuitry may operate as a Class F RF power amplifier, which may use termination circuits to create impedance valleys at even harmonics of an RF carrier frequency to improve a saturated efficiency of the RF power amplifier circuitry. However, the termination circuits of the present disclosure may create impedance valleys that are not at even harmonics of an RF carrier frequency to shape amplitude-based distortion, thereby extending a linear operating range of the RF power amplifier circuitry. Shaping the AM-AM distortion may include reducing the AM-AM distortion, pre-distorting the AM-AM distortion, or both. Similarly, shaping the AM-PM distortion may include reducing the AM-PM distortion, pre-distorting the AM-PM distortion, or both.

In some embodiments of the present disclosure, the RF power amplifier circuitry may operate as either a Class AB amplifier or as a Class B amplifier based on a magnitude of RF output power provided by the RF power amplifier circuitry. A transistor bias circuit in the RF power amplifier circuitry may control transitioning between operating as the Class AB amplifier and operating as the Class B amplifier. When the magnitude of the RF output power is below a first threshold, the RF power amplifier circuitry may operate as a Class AB amplifier, and when the magnitude of the RF output power is above the first threshold, the RF power amplifier circuitry may operate as a Class B amplifier.

By combining the use of termination circuits to shape amplitude-based distortions and transitioning between Class AB and Class B operation, a resistive load line of the RF power amplifier circuitry may be increased, thereby increasing peak efficiency and reducing average current consumption of the RF power amplifier circuitry. Furthermore, emitter areas of amplifier stages of the RF power amplifier circuitry may be reduced, thereby reducing die area and related costs.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 8A is a graph illustrating comparative linearities between Class B, Class AB, and a combination of Class B and Class AB RF power amplifiers.

FIG. 8B is a graph illustrating comparative Figures of Merit (FOM) between Class B, Class AB, and a combination of Class A and Class AB RF power amplifiers.

Figure 19:
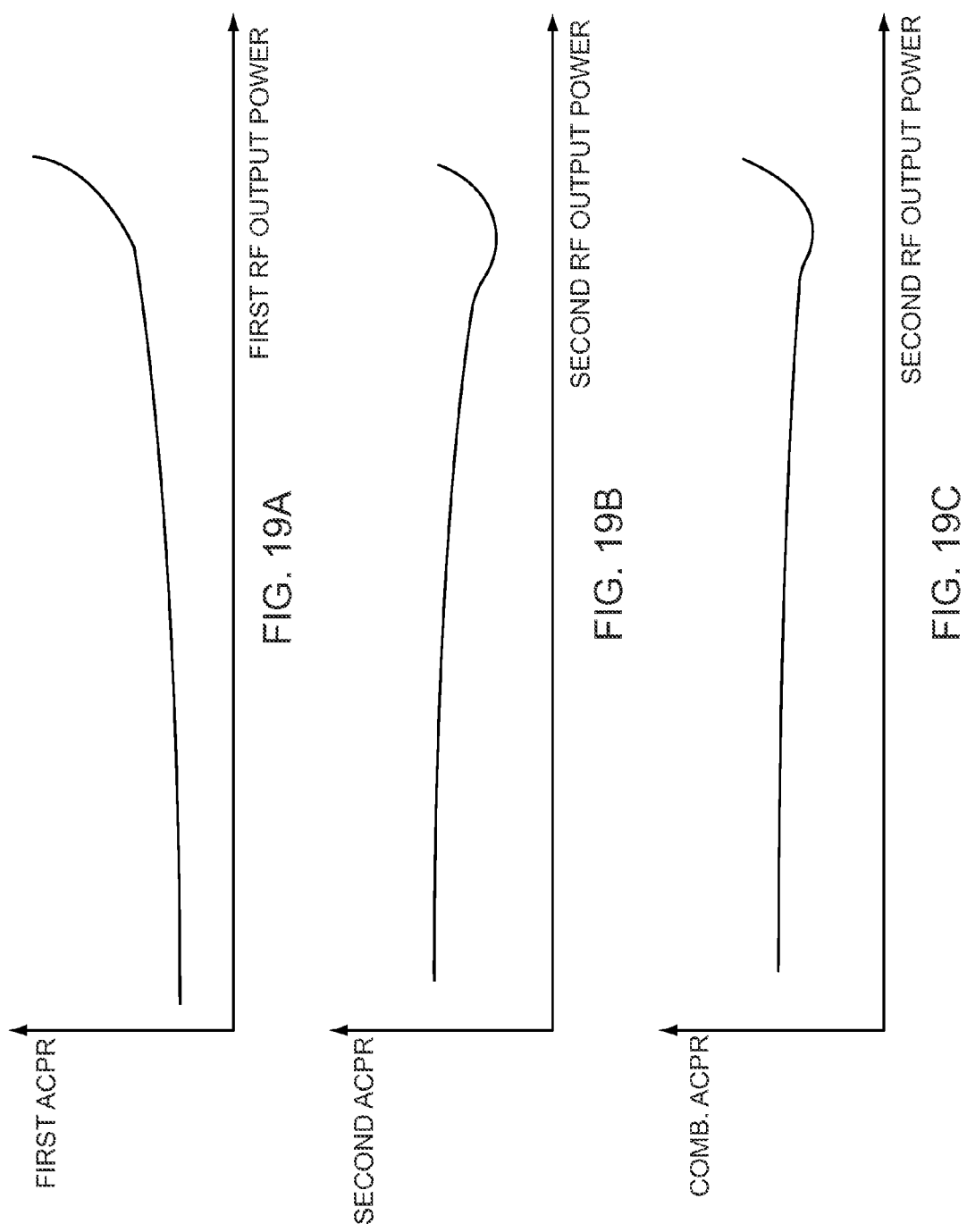

FIGS. 19A, 19B, and 19C are graphs illustrating comparative linearities of the first amplifier stage operating in isolation, the second amplifier stage operating in isolation, and the combination of the first and the second amplifier stages operating as a multi-stage RF amplifier, respectively, according to one embodiment of the first and the second amplifier stages.

Figure 1:
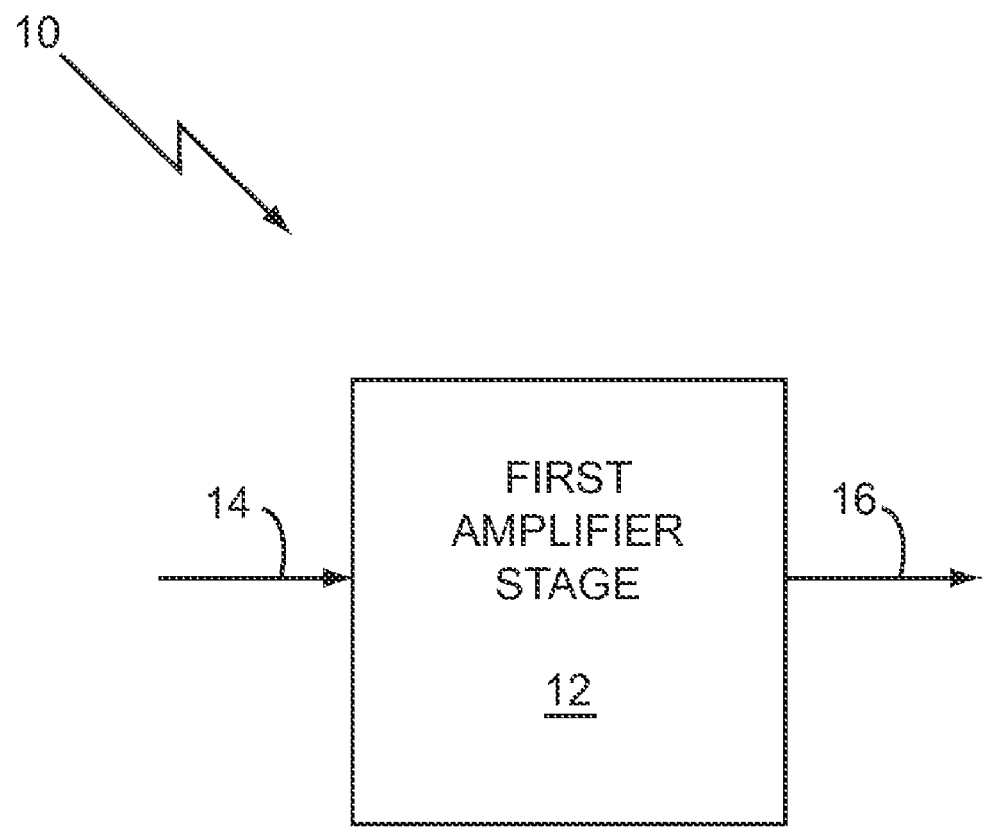
FIG. 1 shows RF power amplifier circuitry according to one embodiment of the RF power amplifier circuitry.
Figure 17:
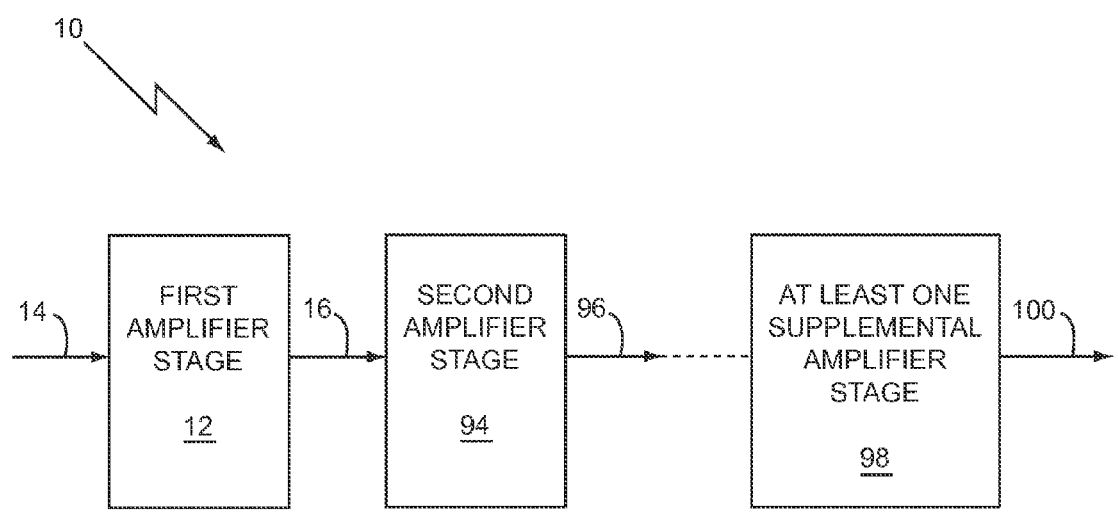
FIG. 17 shows the RF power amplifier circuitry using multiple amplifier stages to form a multi-stage RF amplifier according to an alternate embodiment of the RF power amplifier circuitry.
Figure 20:
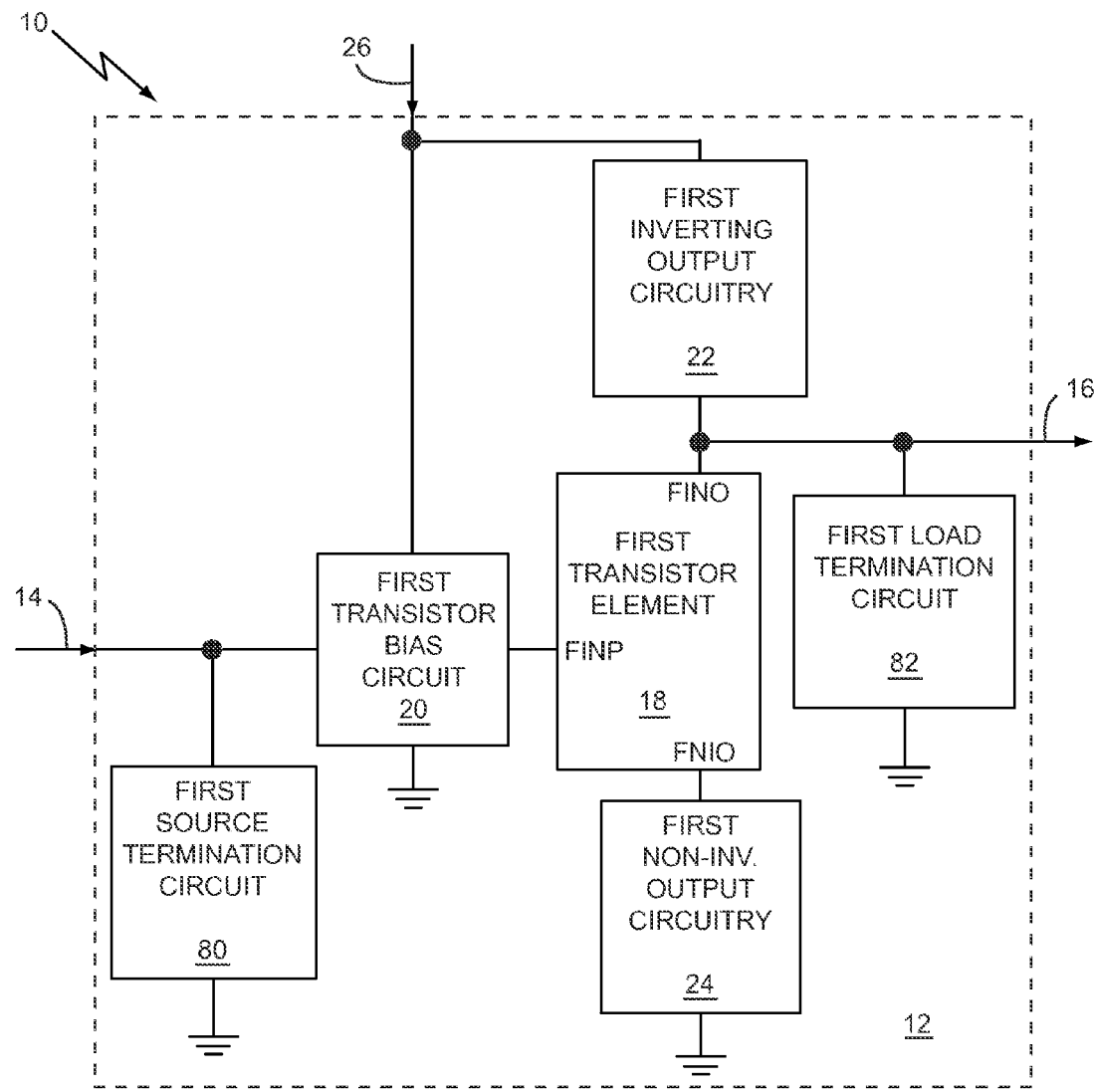

FIG. 20 shows details of the first amplifier stage illustrated in FIG. 1 and FIG. 17 according to an alternate embodiment of the first amplifier stage.

Figure 21:
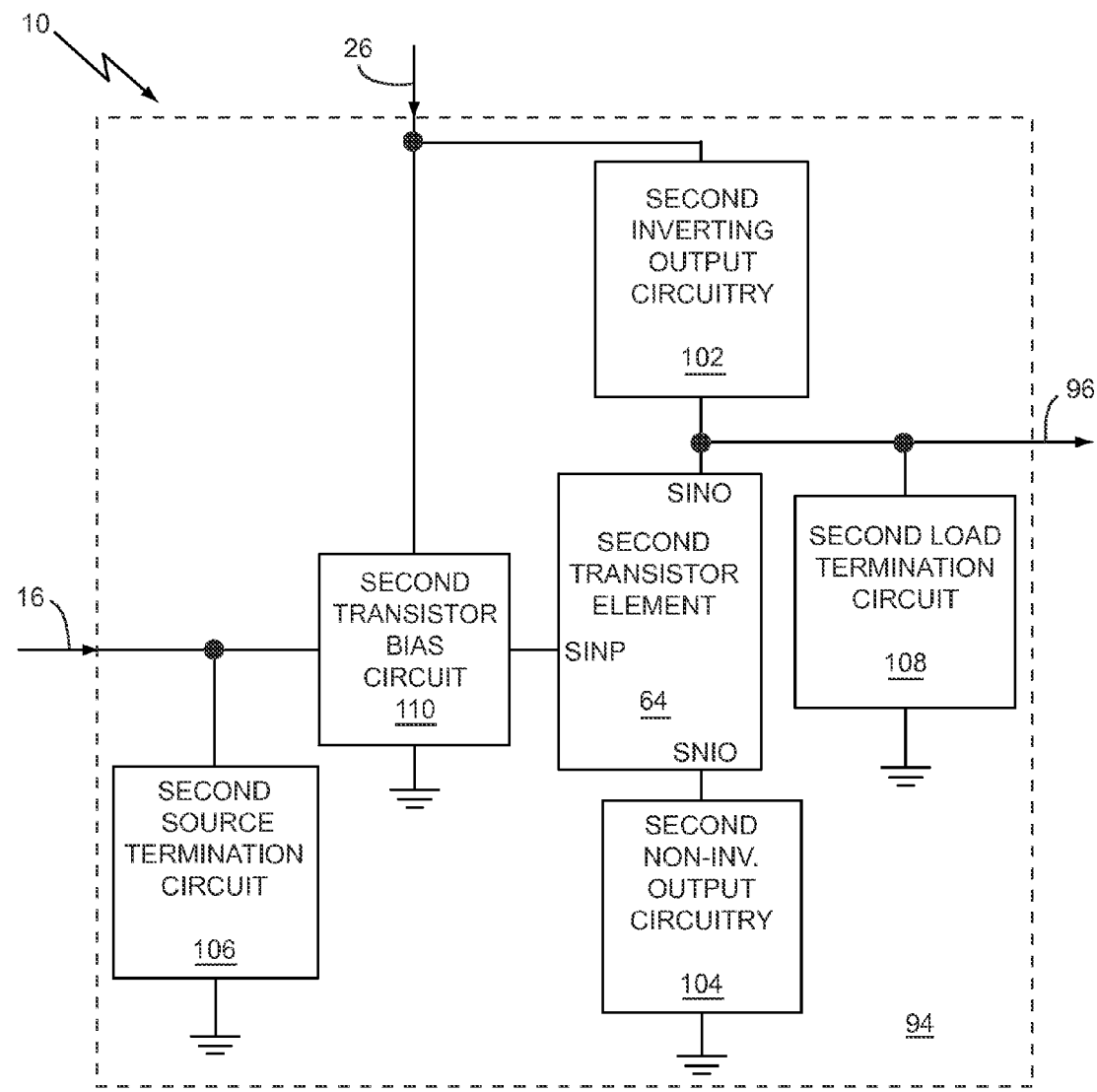

FIG. 21 shows details of the second amplifier stage illustrated in FIG. 17 according to one embodiment of the second amplifier stage.

Figure 22:
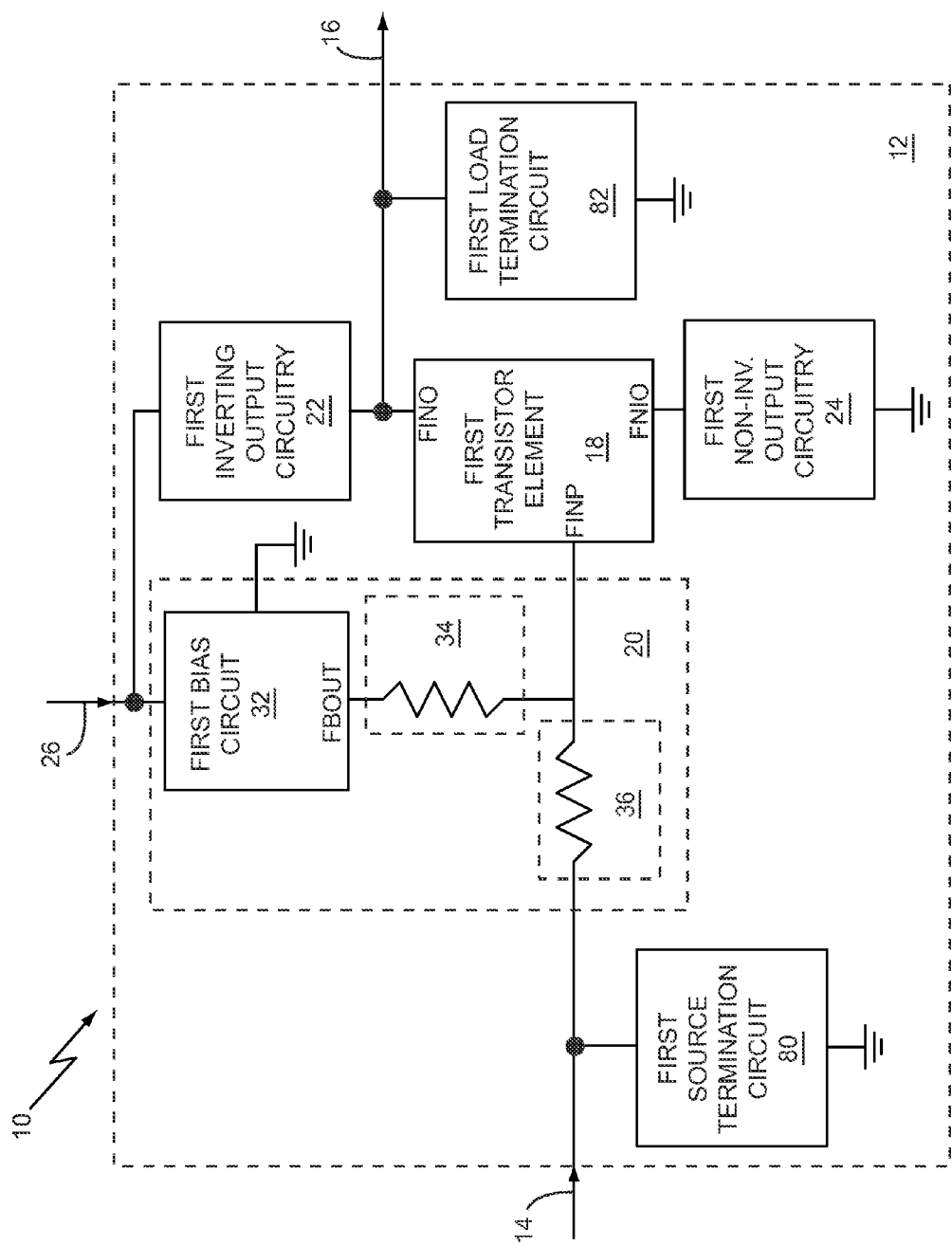

FIG. 22 shows details of the first transistor bias circuit illustrated in FIG. 20 according to one embodiment of the first transistor bias circuit.

Figure 23:
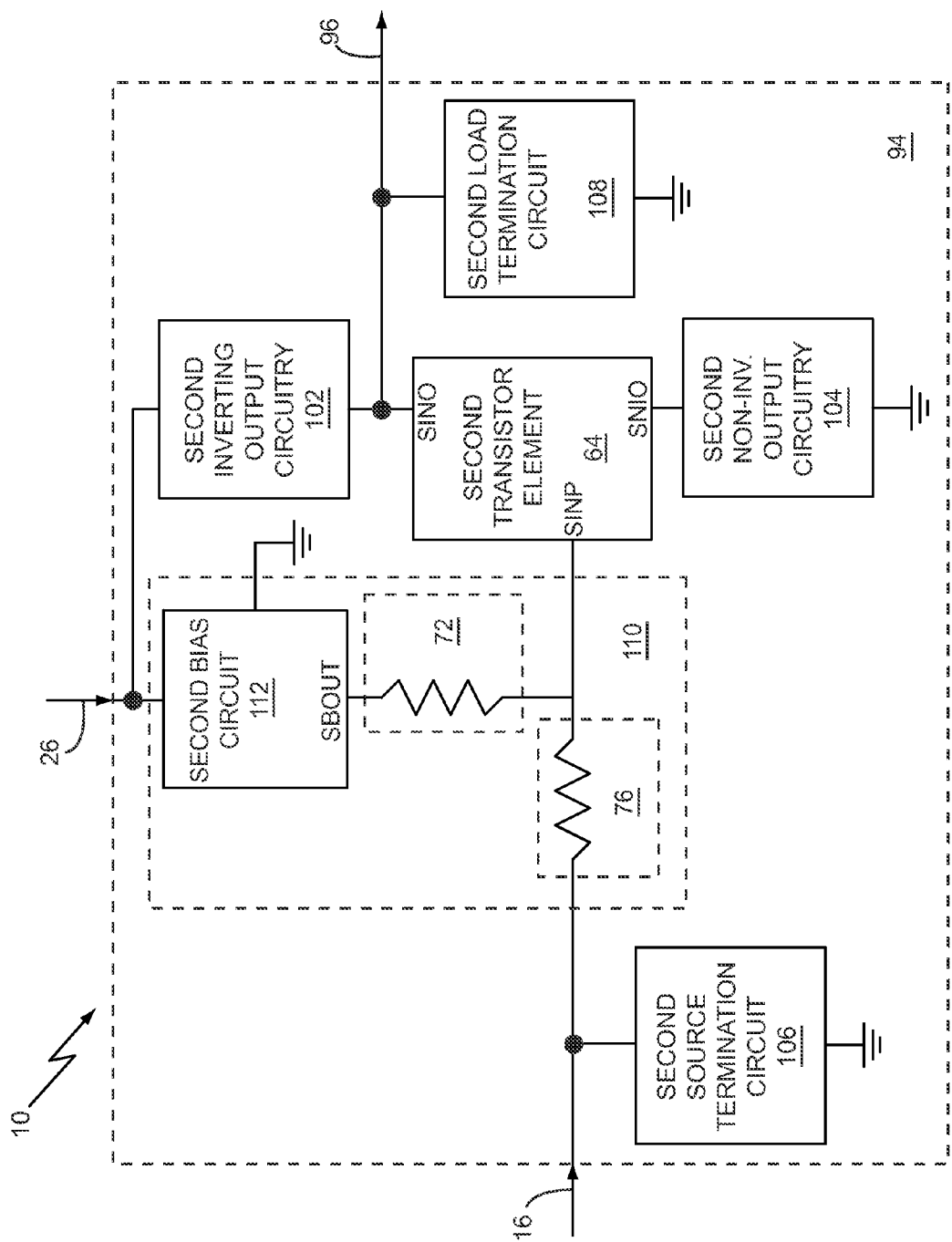

FIG. 23 shows details of a second transistor bias circuit illustrated in FIG. 21 according to one embodiment of the second transistor bias circuit.

Figure 24:
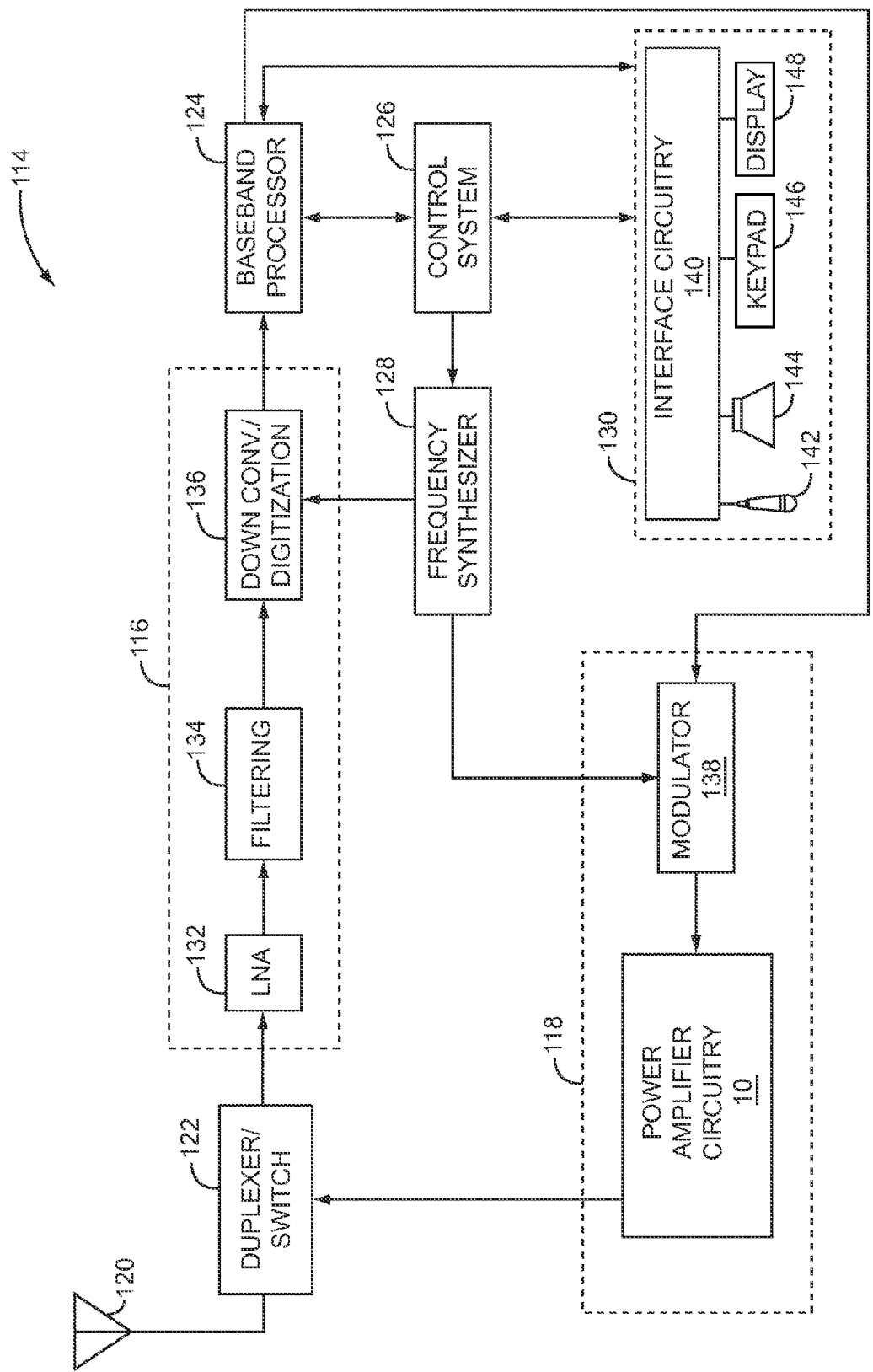

FIG. 24 shows the RF power amplifier circuitry used in a mobile terminal according to an application embodiment of the RF power amplifier circuitry.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

FIG. 1 shows RF power amplifier circuitry 10 according to one embodiment of the RF power amplifier circuitry 10. The RF power amplifier circuitry 10 includes a first amplifier stage 12, which receives and amplifies a first RF input signal 14 to provide a first RF output signal 16 having a first RF output power.

Figure 2:
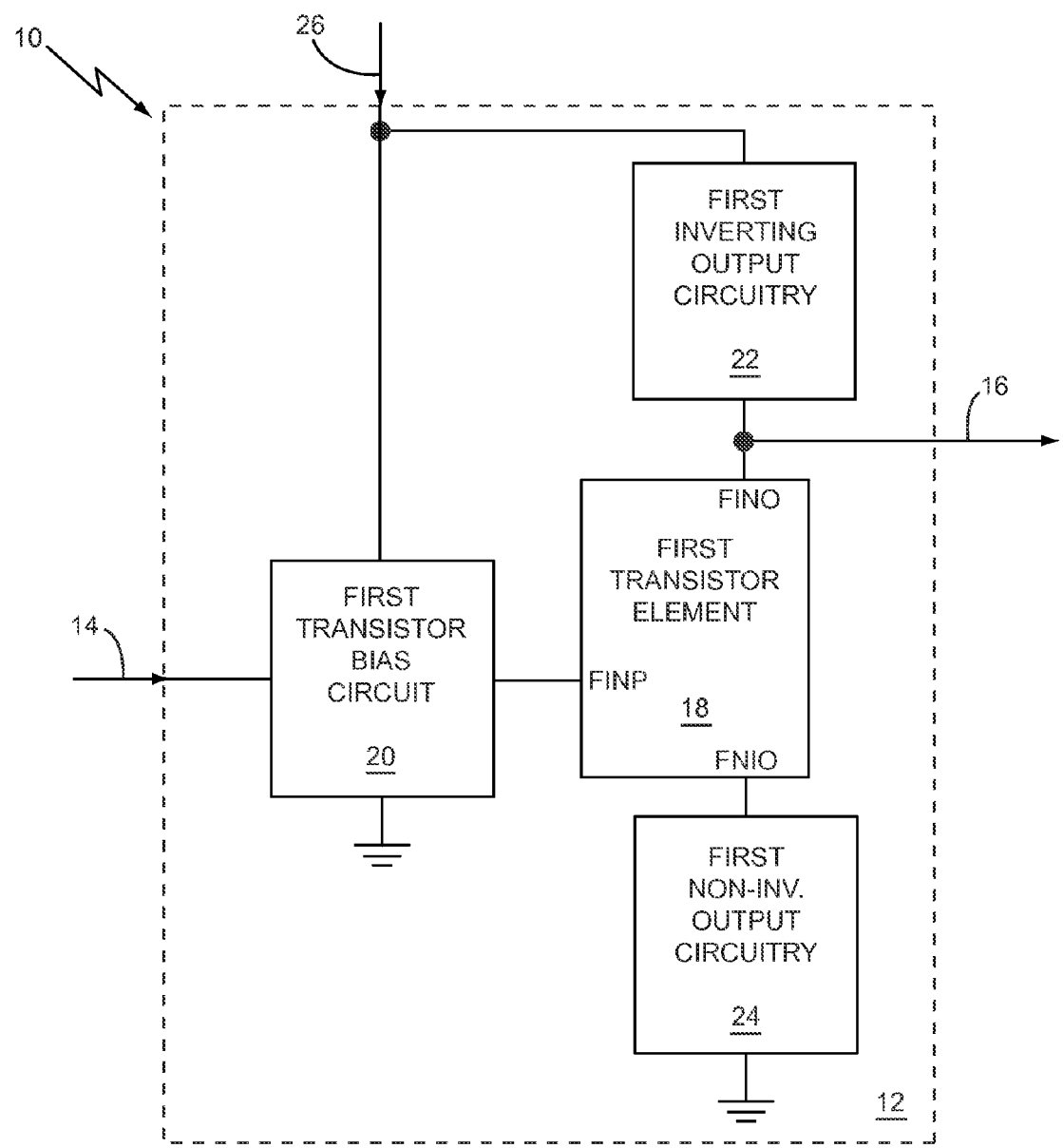
FIG. 2 shows details of a first amplifier stage illustrated in FIG. 1 according to one embodiment of the first amplifier stage.

FIG. 2 shows details of the first amplifier stage 12 illustrated in FIG. 1 according to one embodiment of the first amplifier stage 12. The first amplifier stage 12 includes a first transistor element 18 having a first input FINP, a first inverting output FINO, and a first non-inverting output FNIO. The first amplifier stage 12 further includes a first transistor bias circuit 20, first inverting output circuitry 22, and first non-inverting output circuitry 24. The first transistor bias circuit 20 receives the first RF input signal 14 and is coupled to the first input FINP of the first transistor element 18. Further, the first transistor bias circuit 20 receives a direct current (DC) supply signal 26 and ground, both of which may be used by the first transistor bias circuit 20 to provide an appropriate first DC bias to the first input FINP of the first transistor element 18. The first non-inverting output circuitry 24 is coupled between the first non-inverting output FNIO of the first transistor element 18 and ground.

Other embodiments of the first amplifier stage 12 may omit the first non-inverting output circuitry 24, such that the first non-inverting output FNIO is coupled directly to ground, or another DC reference (not shown). The first inverting output circuitry 22 receives the DC supply signal 26 and is coupled to the first inverting output FINO of the first transistor element 18 to provide the first RF output signal 16, which has the first RF output power. The first transistor element 18 amplifies the first RF input signal 14 to provide the first RF output signal 16.

The first transistor element 18 may operate as either a Class AB amplifier or as a Class B amplifier based on a magnitude of the first RF output power. The first transistor bias circuit 20 controls transitioning between operating as the Class AB amplifier and operating as the Class B amplifier. When the magnitude of the first RF output power is below a first threshold, the first transistor element 18 operates as the Class AB amplifier, and when the magnitude of the RF output power is above the first threshold, the first transistor element 18 operates as the Class B amplifier. Generally, Class B amplifiers have higher operating efficiencies than Class AB amplifiers; however, Class B amplifiers may not meet linearity requirements when operating at low RF output power levels. Conversely, Class AB amplifiers may meet linearity requirements at all RF output power levels, but may have reduced operating efficiencies, which may be particularly troublesome at high RF output power levels. Therefore, by transitioning between Class AB operation and Class B operation, linearity requirements may be met at all RF output power levels and overall operating efficiency may be increased when compared to continuous class AB operation. Peak current consumption, average current consumption, power dissipation, or any combination thereof may be reduced, which may extend battery life in portable wireless applications. A theoretical power added operating efficiency of a Class B amplifier may be as high as 78%. However, a theoretical power added operating efficiency of a Class A amplifier may only be as high as 50%. A theoretical power added operating efficiency of a Class AB amplifier may fall somewhere between 50% to 78%.

Figure 3:
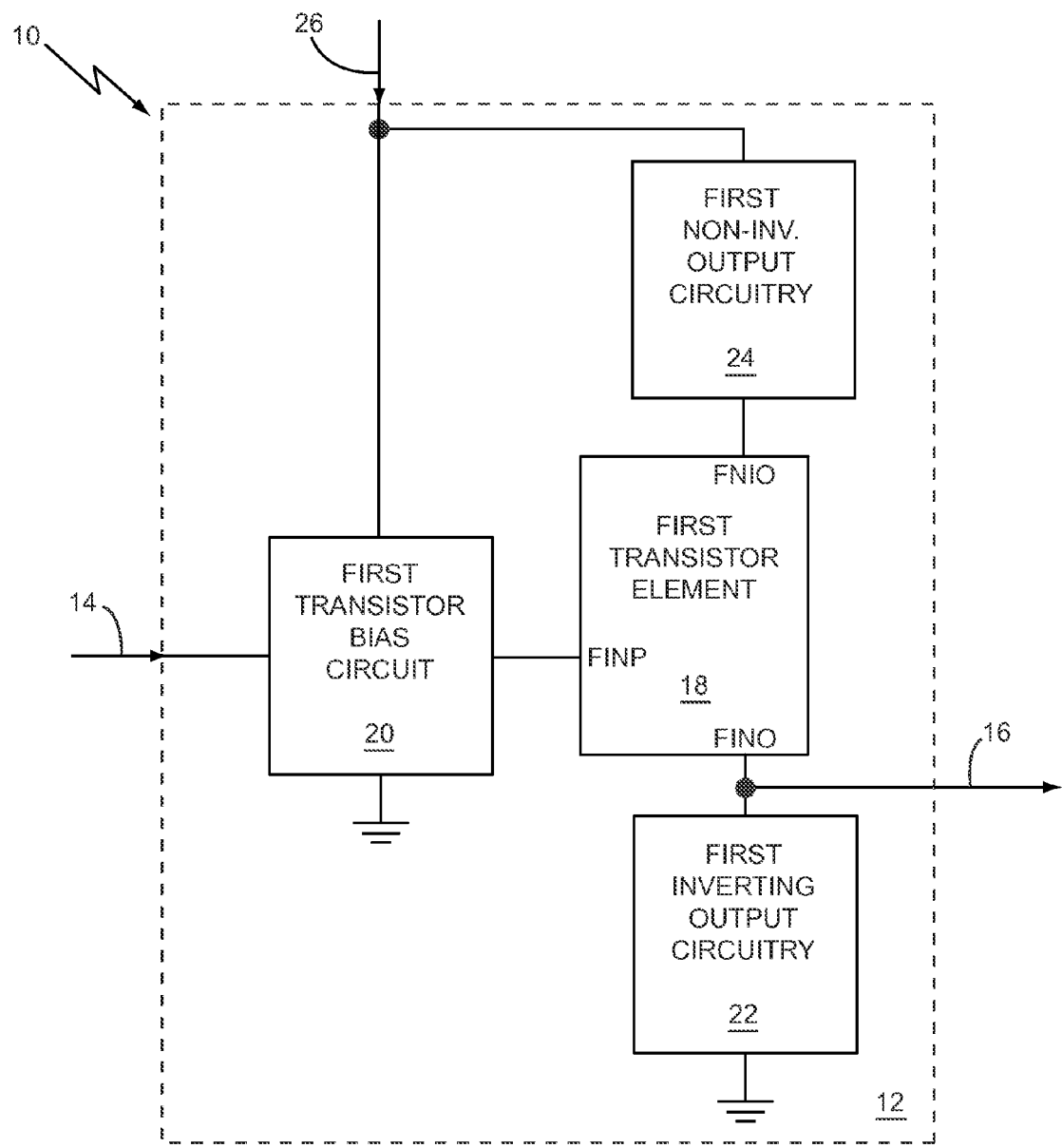
FIG. 3 shows details of the first amplifier stage illustrated in FIG. 1 according to an alternate embodiment of the first amplifier stage.

FIG. 3 shows details of the first amplifier stage 12 illustrated in FIG. 1 according to an alternate embodiment of the first amplifier stage 12. The first amplifier stage 12 illustrated in FIG. 3 is similar to the first amplifier stage 12 illustrated in FIG. 2, except the first inverting output circuitry 22 illustrated in FIG. 3 is coupled to ground instead of receiving the DC supply signal 26, and the first non-inverting output circuitry 24 receives the DC supply signal 26 instead of being coupled to ground. In a first exemplary embodiment of the first transistor element 18 illustrated in FIG. 3, the first transistor element 18 includes a first P-type field effect transistor (P-FET) element (not shown), such that a first gate (not shown) of the first P-FET element is the first input FINP, a first source (not shown) of the first P-FET element is the first non-inverting output FNIO, and a first drain (not shown) of the first P-FET element is the first inverting output FINO. In a second exemplary embodiment of the first transistor element 18 illustrated in FIG. 3, the first transistor element 18 includes a first PNP bipolar transistor element (not shown), such that a first base (not shown) of the first PNP bipolar transistor element is the first input FINP, a first emitter (not shown) of the first PNP bipolar transistor element is the first non-inverting output FNIO, and a first collector (not shown) of the first PNP bipolar transistor element is the first inverting output FINO. In one exemplary embodiment of the first PNP bipolar transistor element, the first PNP bipolar transistor element is a first heterojunction bipolar transistor (HBT) element (not shown).

Figure 4:
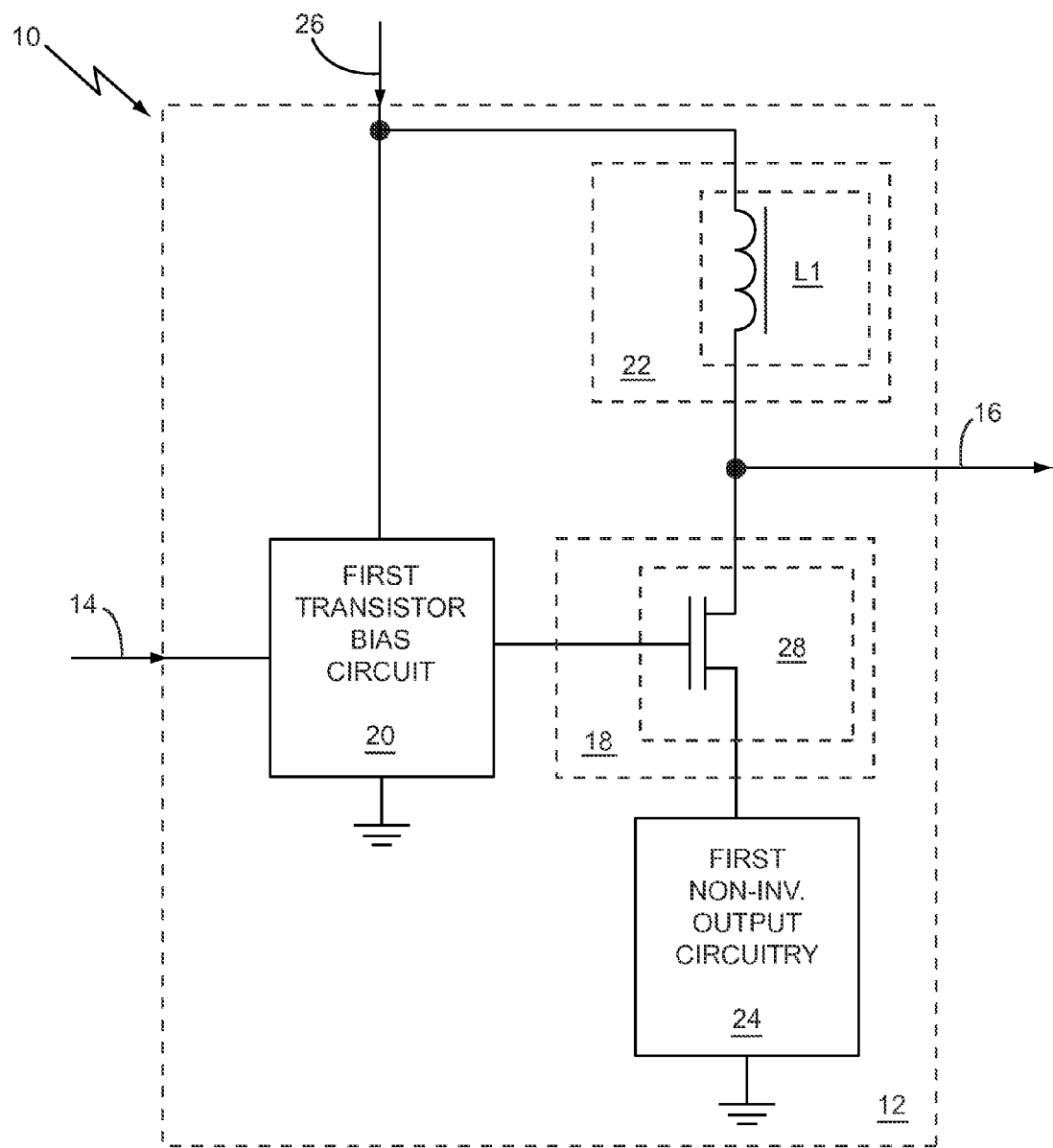
FIG. 4 shows details of a first transistor element and first inverting output circuitry illustrated in FIG. 2 according to one embodiment of the first transistor element and the first inverting output circuitry.

FIG. 4 shows details of the first transistor element 18 and the first inverting output circuitry 22 illustrated in FIG. 2 according to one embodiment of the first transistor element 18 and the first inverting output circuitry 22. The first inverting output circuitry 22 includes a first inductive element L1, which is coupled to the first inverting output FINO (not shown) of the first transistor element 18 to provide the first RF output signal 16, and receives the DC supply signal 26. The first transistor element 18 includes a first N-type field effect transistor (N-FET) element 28, such that a first gate of the first N-FET element 28 is the first input FINP (not shown), a first source of the first N-FET element 28 is the first non-inverting output FNIO (not shown), and a first drain of the first N-FET element 28 is the first inverting output FINO (not shown). The first drain of the first N-FET element 28 is coupled to the first inductive element L1 to provide the first RF output signal 16. The first inductive element L1 may be used to isolate the first RF output signal 16 from the DC supply signal 26.

Figure 5:
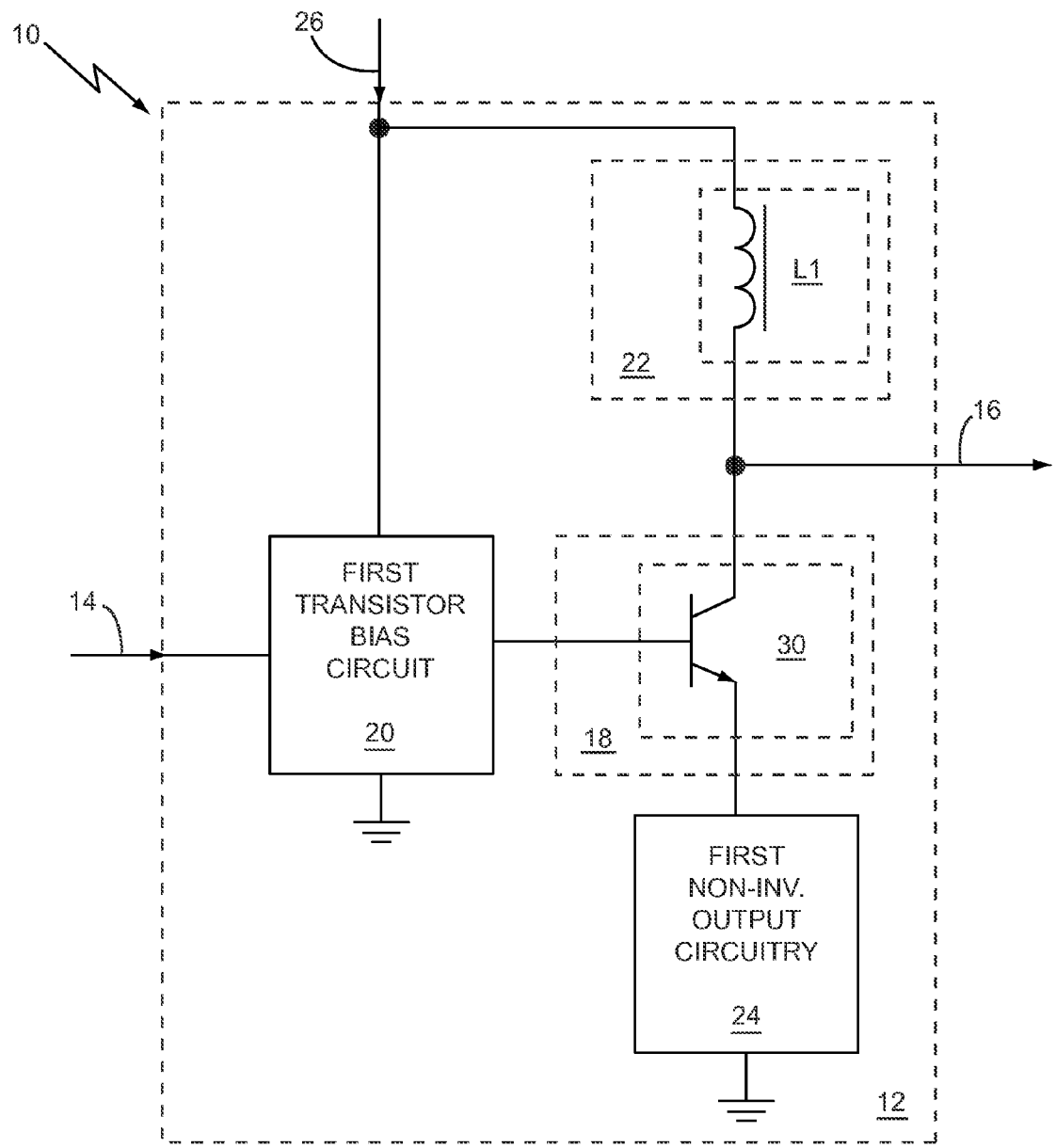
FIG. 5 shows details of the first transistor element and the first inverting output circuitry illustrated in FIG. 2 according to an alternate embodiment of the first transistor element and the first inverting output circuitry.

FIG. 5 shows details of the first transistor element 18 and the first inverting output circuitry 22 illustrated in FIG. 2 according to an alternate embodiment of the first transistor element 18 and the first inverting output circuitry 22. The first inverting output circuitry 22 includes the first inductive element L1, which is coupled to the first inverting output FINO (not shown) of the first transistor element 18 to provide the first RF output signal 16, and receives the DC supply signal 26. The first transistor element 18 includes a first NPN bipolar transistor element 30, such that a first base of the first NPN bipolar transistor element 30 is the first input FINP (not shown), a first emitter of the first NPN bipolar transistor element 30 is the first non-inverting output FNIO (not shown), and a first collector of the first NPN bipolar transistor element 30 is the first inverting output FINO (not shown). The first collector of the first NPN bipolar transistor element 30 is coupled to the first inductive element L1 to provide the first RF output signal 16. The first inductive element L1 may be used to isolate the first RF output signal 16 from the DC supply signal 26. In an exemplary embodiment of the first transistor element 18, the first transistor element 18 is a first bipolar transistor element, such as the first NPN bipolar transistor element 30. In an exemplary embodiment of the first bipolar transistor element, the first bipolar transistor element is a first HBT element.

Figure 6:
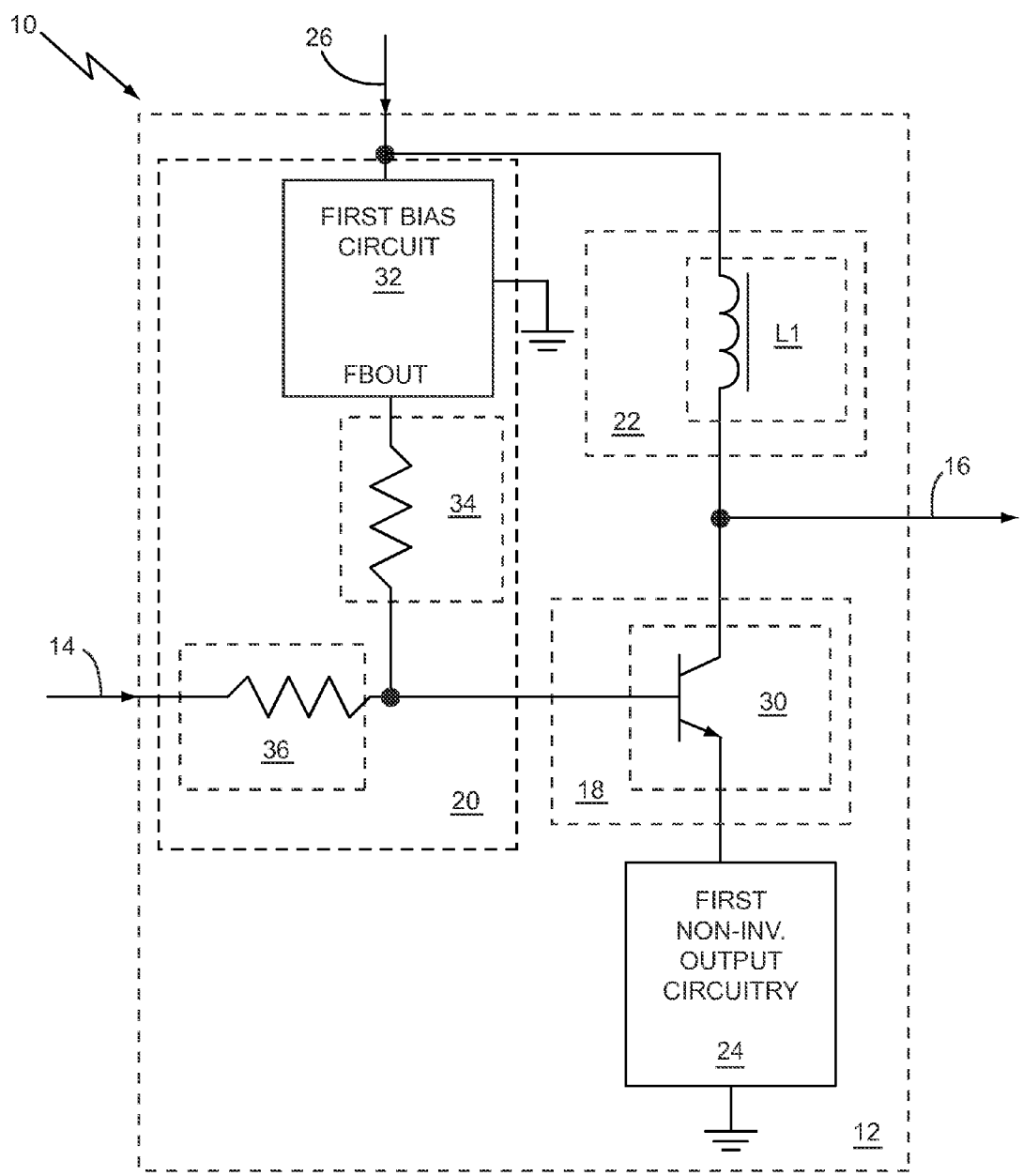
FIG. 6 shows details of a first transistor bias circuit illustrated in FIG. 5 according to one embodiment of the first transistor bias circuit.

FIG. 6 shows details of the first transistor bias circuit 20 illustrated in FIG. 5 according to one embodiment of the first transistor bias circuit 20. The first transistor bias circuit 20 includes a first bias circuit 32 having a first bias output FBOUT, a first ballast resistive element 34, and a first series resistive element 36. The first bias circuit 32 is coupled to ground and receives the DC supply signal 26 to provide an appropriate DC bias voltage at the first bias output FBOUT. The first ballast resistive element 34 is coupled between the first bias output FBOUT and the first base of the first NPN bipolar transistor element 30. The first series resistive element 36 is coupled to the first base of the first NPN bipolar transistor element 30 and receives the first RF input signal 14. The first DC bias may be provided to the first input FINP of the first transistor element 18 by the first bias output FBOUT of the first bias circuit 32 through the first ballast resistive element 34, by the first series resistive element 36, or both. Therefore, the first DC bias may be based on the first bias circuit 32 and the first ballast resistive element 34, on the first series resistive element 36, or both.

Figure 7A:
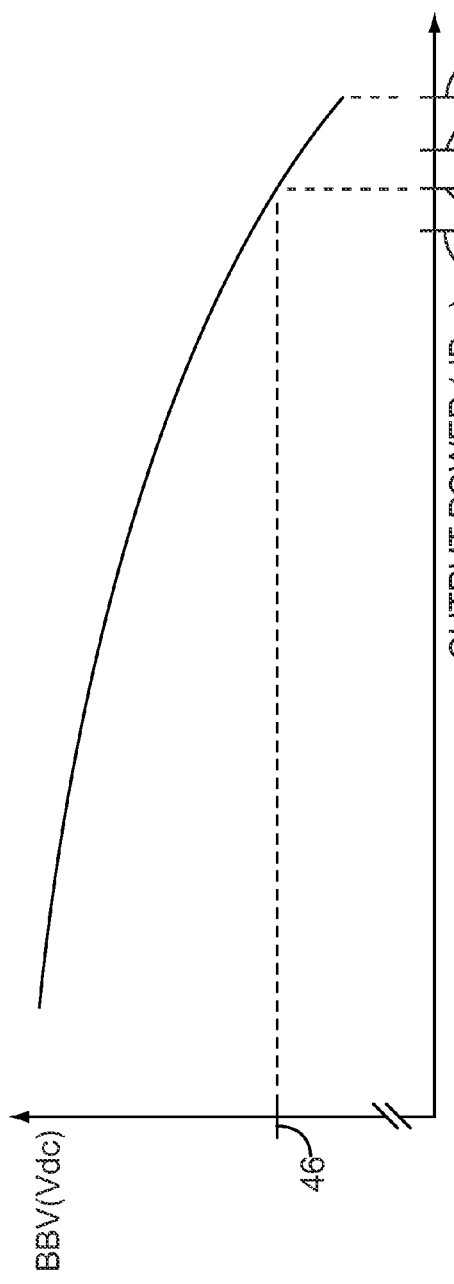
FIG. 7A is a graph illustrating a relationship between output power from the first amplifier stage and a base bias voltage (BBV) at a first base of a first NPN bipolar transistor element illustrated in FIG. 6.

FIG. 7A is a graph illustrating a relationship between the first RF output power, which is shown in decibel milliwatts (dBm), from the first amplifier stage 12 and a base bias voltage (BBV), which is shown in DC volts (Vdc), at the first base of the first NPN bipolar transistor element 30 illustrated in FIG. 6. The first RF output power is associated with a maximum rated output power 38 and a first threshold 40, which falls between a first transition range minimum power 42 and a first transition range maximum power 44. When the magnitude of the first RF output power is below the first threshold 40, the first transistor element 18 (FIG. 6) operates as a Class AB amplifier, and when the magnitude of the RF output power is above the first threshold 40, the first transistor element 18 operates as a Class B amplifier. As the first RF output power increases, the BBV decreases due to increased DC base current in the first base of the first transistor element 18 that is divided between the first ballast resistive element 34, and the first series resistive element 36. The increased DC base current causes a corresponding increased voltage drop across the first resistive elements 34, 36, thereby causing the BBV to drop.

When the BBV drops to a knee voltage 46, which corresponds to the first threshold 40, the first transistor element 18 (FIG. 6) transitions from operating as a Class AB amplifier to operating as a Class B amplifier. Conversely, as the first RF output power decreases and the BBV increases to the knee voltage 46, the first transistor element 18 (FIG. 6) transitions from operating as a Class B amplifier to operating as a Class AB amplifier. Therefore, when the magnitude of the first RF output power is below the first threshold 40, the first transistor element 18 (FIG. 6) operates as a Class AB amplifier based on the first ballast resistive element 34, the first series resistive element 36, or both. Similarly, when the magnitude of the RF output power is above the first threshold 40, the first transistor element 18 (FIG. 6) operates as a Class B amplifier based on the first ballast resistive element 34, the first series resistive element 36, or both. The knee voltage 46 may be approximated by EQ. 1, as shown below.

$$\alpha = \frac{(V_{CC} - V_{ce}^{sat})}{V_{CC}}, \quad \text{EQ. 1}$$

where

α is the knee voltage 46, $V_{CC}$ is a voltage magnitude of the DC supply signal 26 (FIG. 6), and $V_{ce}^{sat}$ is a collector-emitter saturation voltage of the first NPN bipolar transistor element 30 (FIG. 6).

In a first exemplary embodiment of the first transistor element 18, the maximum rated output power 38 is about 28 dBm, the first transition range minimum power 42 is about 24 dBm, and the first transition range maximum power 44 is about 26 dBm. Therefore, the first threshold 40 is between about 24 dBm and about 26 dBm. In a second exemplary embodiment of the first transistor element 18, the maximum rated output power 38 is about 18 dBm, the first transition range minimum power 42 is about 15 dBm, and the first transition range maximum power 44 is about 17 dBm. Therefore, the first threshold 40 is between about 15 dBm and about 17 dBm. In a third exemplary embodiment of the first transistor element 18, the maximum rated output power 38 is about 20.5 dBm, the first transition range minimum power 42 is about 17 dBm, the first transition range maximum power 44 is about 19 dBm. Therefore, the first threshold 40 is between about 17 dBm and about 19 dBm.

Figure 7B:
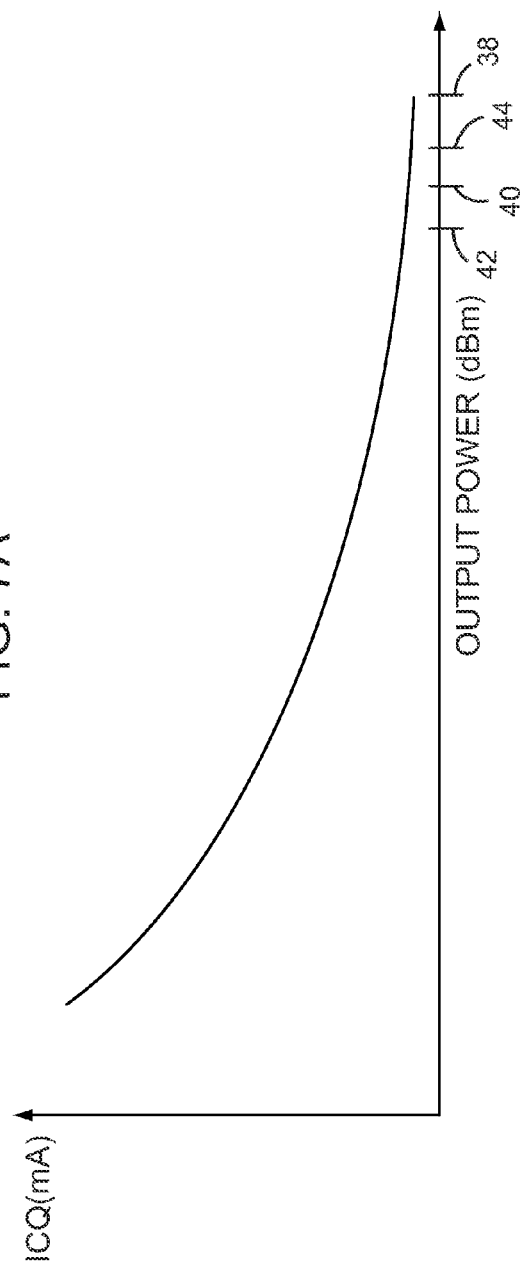
FIG. 7B is a graph illustrating a relationship between the output power from the first amplifier stage and a collector quiescent current (ICQ) at a first collector of the first NPN bipolar transistor element illustrated in FIG. 6.

FIG. 7B is a graph illustrating a relationship between the first RF output power from the first amplifier stage 12 and a collector quiescent current (ICQ), which is shown in milliamps (mA), at the first collector of the first NPN bipolar transistor element 30 illustrated in FIG. 6. As the first RF output power increases and the BBV (FIG. 7A) decreases toward the knee voltage 46 (FIG. 7a), the ICQ decreases, which is indicative of the first amplifier stage 12 moving closer to Class B operation and away from Class AB operation. Once the first RF output power increases beyond the first threshold 40, the first amplifier stage 12 operates as a Class B amplifier. Conversely, as the first RF output power decreases and the BBV (FIG. 7A) increases toward the knee voltage 46 (FIG. 7A), the ICQ increases, which is indicative of the first amplifier stage 12 moving closer to Class AB operation and away from Class B operation. Once the first RF output power decreases below the first threshold 40, the first amplifier stage 12 operates as a Class AB amplifier. In Class B operation, the first NPN bipolar transistor element 30 operates closer to saturation, which is why ICQ drops. Conversely, in Class AB operation, the first NPN bipolar transistor element 30 operates further away from saturation, which is why ICQ increases.

FIG. 8A is a graph illustrating comparative linearities between Class B, Class AB, and a combination of Class A and Class AB RF power amplifiers. FIG. 8A illustrates a relationship between the first RF output power, which is shown in dBm, from the first amplifier stage 12 and an adjacent channel power ratio (ACPR), which is shown in decibels relative to carrier power (dBc), of the Class B, the Class AB, and the combination of Class A and Class AB RF power amplifiers. The ACPR may be indicative of linearity in RF power amplifiers. Similar to FIGS. 7A and 7B, the first RF output power is associated with the maximum rated output power 38 and the first threshold 40, which falls between the first transition range minimum power 42 and the first transition range maximum power 44. A Class B only ACPR response curve 48 is associated with a Class B only RF power amplifier, a Class AB only ACPR response curve 50 is associated with a Class AB only RF power amplifier, and a combination ACPR response curve 52 may be associated with the first amplifier stage 12. An ACPR acceptable limit curve 54 may illustrate acceptable ACPR limits for certain wireless communications protocols. ACPRs falling below the ACPR acceptable limit curve 54 exceed ACPR requirements and ACPRs falling above the ACPR acceptable limit curve 54 fail to meet ACPR requirements. In an exemplary embodiment of the present disclosure, at RF output powers below the first transition range minimum power 42, the acceptable ACPR limit may be about −32 dBc.

According to the Class B only ACPR response curve 48, at most RF output powers below the first threshold 40, the Class B only RF power amplifier does not meet ACPR requirements. Therefore, the Class B only RF power amplifier may be unacceptable for certain wireless communications protocols. According to the Class AB only ACPR response curve 50 and the combination ACPR response curve 52, both the Class AB only RF power amplifier and the first amplifier stage 12 exceed ACPR requirements. However, the power added operating efficiency of the first amplifier stage 12 may exceed the power added operating efficiency of the Class AB only RF power amplifier, particularly at high RF output power levels since the first amplifier stage 12 operates as a Class B amplifier at RF output power levels above the first threshold 40.

FIG. 8B is a graph illustrating comparative Figures of Merit (FOM) between Class B, Class AB, and a combination of Class A and Class AB RF power amplifiers. FIG. 8B illustrates a relationship between the first RF output power, which is shown in dBm, from the first amplifier stage 12 and the FOM of the Class B, the Class AB, and the combination of Class A and Class AB RF power amplifiers. FOM is defined as the sum of the power added operating efficiency, which is expressed in percent, of an RF power amplifier and the absolute value of ACPR, which is expressed in dBc, of the RF power amplifier. For example, an RF power amplifier having a power added operating efficiency of 45% and an ACPR of −42 dBc would have an FOM of 87. Therefore, higher FOMs may be preferred. Similar to FIGS. 7A and 7B, the first RF output power is associated with the maximum rated output power 38 and the first threshold 40, which falls between the first transition range minimum power 42 and the first transition range maximum power 44.

A Class B FOM curve 56 is associated with a Class B only RF power amplifier, a Class AB FOM curve 58 is associated with a Class AB only RF power amplifier, and a combination FOM curve 60 may be associated with the first amplifier stage 12. When the RF output powers of the Class B only RF power amplifier, the Class AB only RF power amplifier, and the first amplifier stage 12 are all below the first threshold 40, the Class B only RF power amplifier has the lowest FOM due to a low ACPR, the Class AB only RF power amplifier has the highest FOM due to a high ACPR, and the first amplifier stage 12 has an FOM between the FOM of the Class B only RF power amplifier and the FOM of the Class AB only RF power amplifier. However, since the ACPR of the first amplifier stage 12 meets ACPR requirements, the FOM of the first amplifier stage 12 may be acceptable. Conversely, when the RF output powers of the Class B only RF power amplifier, the Class AB only RF power amplifier, and the first amplifier stage 12 are all above the first threshold 40, the Class B only RF power amplifier has the highest FOM due to a high power added operating efficiency, the Class AB only RF power amplifier has the lowest FOM due to a low power added operating efficiency, and the first amplifier stage 12 has an FOM between the FOM of the Class B only RF power amplifier and the FOM of the Class AB only RF power amplifier. However, the FOM of the first amplifier stage 12 is nearly as high as the FOM of the Class B only RF power amplifier. Therefore, based on overall FOM, the first amplifier stage 12 may be preferred over the Class B only RF power amplifier and the Class AB only RF power amplifier.

Figure 9:
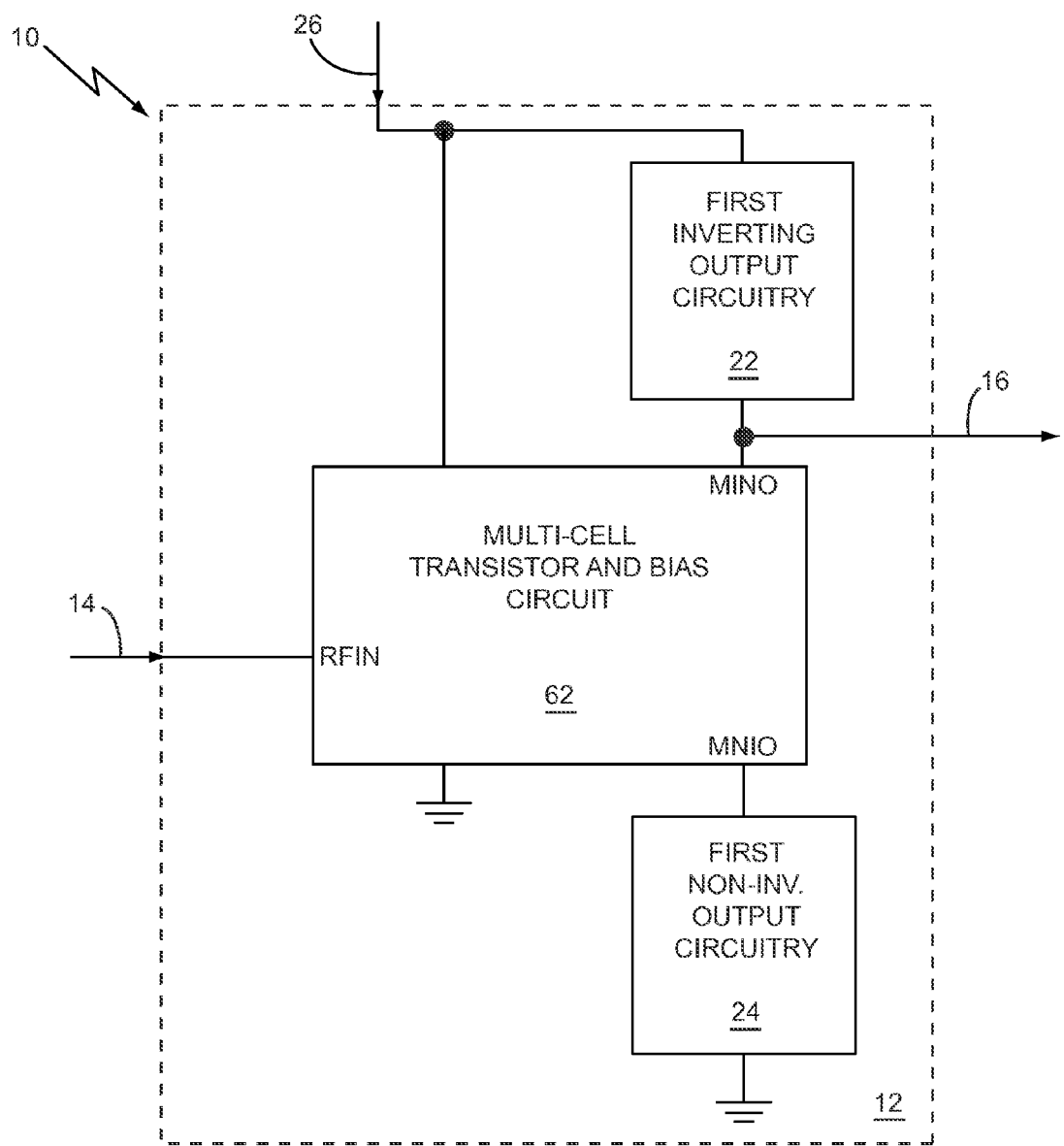
FIG. 9 shows details of the first amplifier stage illustrated in FIG. 1 according to an additional embodiment of the first amplifier stage.

FIG. 9 shows details of the first amplifier stage 12 illustrated in FIG. 1 according to an additional embodiment of the first amplifier stage 12. The first amplifier stage 12 illustrated in FIG. 9 is similar to the first amplifier stage 12 illustrated in FIG. 2, except in the first amplifier stage 12 illustrated in FIG. 9 the first transistor element 18 and the first transistor bias circuit 20 are replaced with a multi-cell transistor and bias circuit 62 having an RF input RFIN, a multi-cell inverting output MINO, and a multi-cell non-inverting output MNIO. The multi-cell transistor and bias circuit 62 includes a multi-cell transistor in place of the first transistor element 18, which may be a single-cell transistor. Multi-cell transistors may be used in place of single-cell transistors to increase power ratings, improve linearity at high power levels, compensate for circuit parasitics, the like, or any combination thereof.

The first amplifier stage 12 further includes the first inverting output circuitry 22 and the first non-inverting output circuitry 24. The RF input RFIN of the multi-cell transistor and bias circuit 62 receives the first RF input signal 14. Further, the multi-cell transistor and bias circuit 62 receives the DC supply signal 26 and ground, both of which may be used to provide an appropriate DC bias to the multi-cell transistor (not shown) in the multi-cell transistor and bias circuit 62. The first non-inverting output circuitry 24 is coupled between the multi-cell non-inverting output MNIO of the multi-cell transistor and bias circuit 62 and ground. Other embodiments of the first amplifier stage 12 may omit the first non-inverting output circuitry 24, such that the multi-cell non-inverting output MNIO is coupled directly to ground, or another DC reference (not shown). The first inverting output circuitry 22 receives the DC supply signal 26 and is coupled to the multi-cell inverting output MINO of the multi-cell transistor and bias circuit 62 to provide the first RF output signal 16, which has the first RF output power. The multi-cell transistor and bias circuit 62 amplifies the first RF input signal 14 to provide the first RF output signal 16.

The multi-cell transistor and bias circuit 62 may operate as either a Class AB amplifier or as a Class B amplifier based on a magnitude of the first RF output power. The multi-cell transistor and bias circuit 62 controls transitioning between operating as the Class AB amplifier and operating as the Class B amplifier. When the magnitude of the first RF output power is below the first threshold 40, the multi-cell transistor and bias circuit 62 operates as the Class AB amplifier, and when the magnitude of the RF output power is above the first threshold 40, the multi-cell transistor and bias circuit 62 operates as the Class B amplifier.

Figure 10:
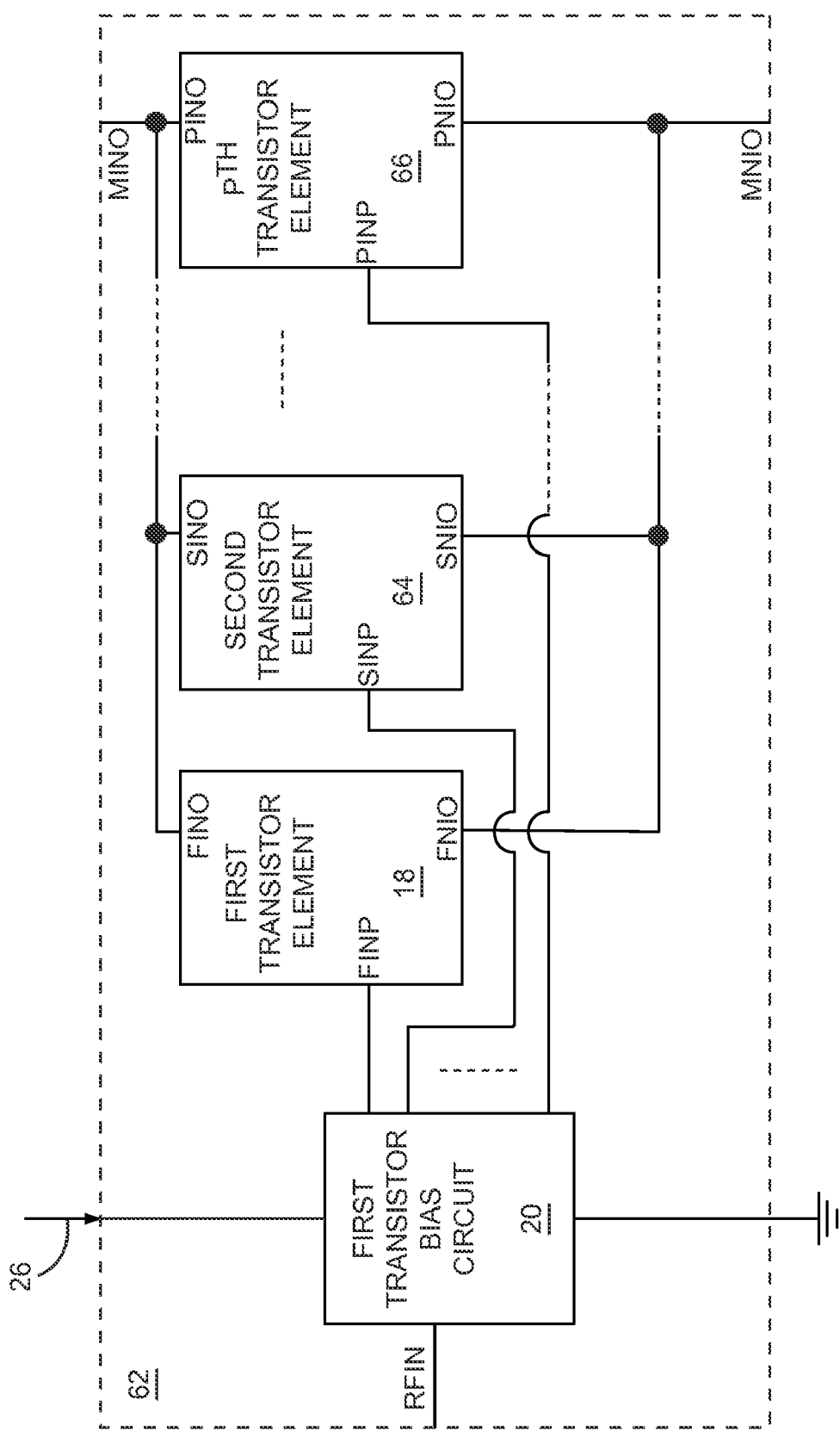
FIG. 10 shows details of a multi-cell transistor and bias circuit illustrated in FIG. 9 according to one embodiment of the multi-cell transistor and bias circuit.

FIG. 10 shows details of the multi-cell transistor and bias circuit 62 illustrated in FIG. 9 according to one embodiment of the multi-cell transistor and bias circuit 62. The multi-cell transistor and bias circuit 62 includes the first transistor bias circuit 20, the first transistor element 18, a second transistor element 64, and up to and including a $P^{TH}$ transistor element 66. The transistor elements 18, 64, 66 collectively form the multi-cell transistor, such that each of the transistor elements 18, 64, 66 functions as a single-cell in the multi-cell transistor. As previously mentioned, the first transistor element 18 includes the first input FINP, the first inverting output FINO, and the first non-inverting output FNIO. Similarly, the second transistor element 64 includes a second input SINP, a second inverting output SINO, and a second non-inverting output SNIO, and the $P^{TH}$ transistor element 66 includes a $P^{TH}$ input PINP, a $P^{TH}$ inverting output PINO, and a $P^{TH}$ non-inverting output PNIO. The first, the second, and up to and including the $P^{TH}$ non-inverting outputs FNIO, SNIO, PNIO are coupled to the multi-cell non-inverting output MNIO. Similarly, the first, the second, and up to and including the $P^{TH}$ inverting outputs FINO, SINO, PINO are coupled to the multi-cell inverting output MINO.

Each of the first, the second, and up to and including the $P^{TH}$ inputs FINP, SINP, PINP are individually coupled to the first transistor bias circuit 20 to assure proper DC bias to each of the transistor elements 18, 64, 66. The first transistor bias circuit 20 is coupled to the RF input RFIN to receive the first RF input signal 14 (not shown). Further, the first transistor bias circuit 20 receives the DC supply signal 26 and ground, both of which may be used by the first transistor bias circuit 20 to provide the appropriate DC bias to each of the transistor elements 18, 64, 66. The transistor elements 18, 64, 66 collectively amplify the first RF input signal 14 to provide the first RF output signal 16 (not shown).

Figure 11:
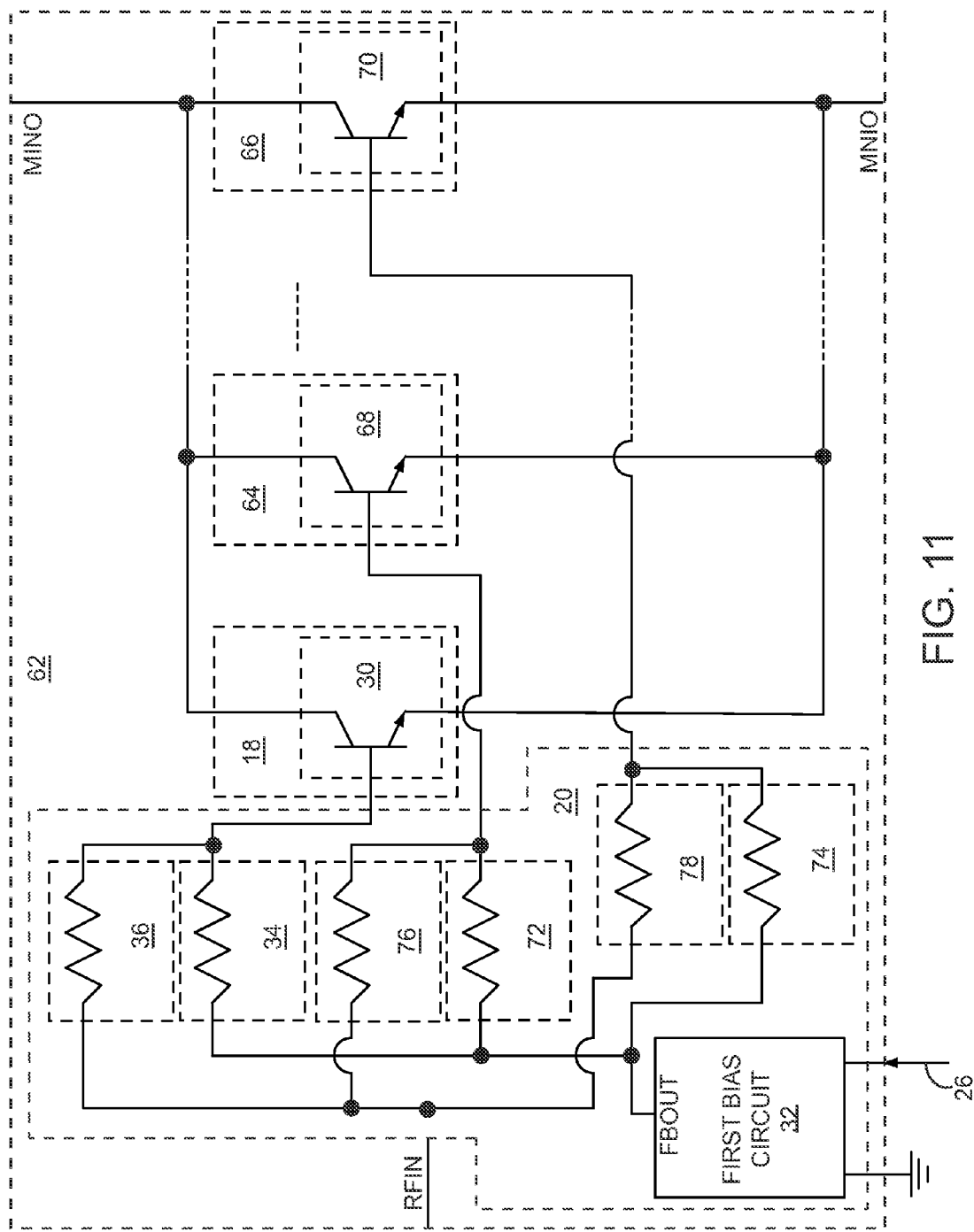
FIG. 11 shows details of the first transistor element, a second transistor element, a $P^{TH}$ transistor element, and the first transistor bias circuit illustrated in FIG. 10 according to one embodiment of the first transistor element, the second transistor element, the $P^{TH}$ transistor element, and the first transistor bias circuit.

FIG. 11 shows details of the first transistor element 18, the second transistor element 64, the $P^{TH}$ transistor element 66, and the first transistor bias circuit 20 illustrated in FIG. 10 according to one embodiment of the first transistor element 18, the second transistor element 64, the $P^{TH}$ transistor element 66, and the first transistor bias circuit 20. The first transistor element 18 includes the first NPN bipolar transistor element 30, such that the first base of the first NPN bipolar transistor element 30 is the first input FINP (not shown), the first emitter of the first NPN bipolar transistor element 30 is the first non-inverting output FNIO (not shown), and the first collector of the first NPN bipolar transistor element 30 is the first inverting output FINO (not shown). The second transistor element 64 includes a second NPN bipolar transistor element 68, such that a second base of the second NPN bipolar transistor element 68 is the second input SINP (not shown), a second emitter of the second NPN bipolar transistor element 68 is the second non-inverting output SNIO (not shown), and a second collector of the second NPN bipolar transistor element 68 is the second inverting output SINO (not shown). The $P^{TH}$ transistor element 66 includes a $P^{TH}$ NPN bipolar transistor element 70, such that a $P^{TH}$ base of the $P^{TH}$ NPN bipolar transistor element 70 is the $P^{TH}$ input PINP (not shown), a $P^{TH}$ emitter of the $P^{TH}$ NPN bipolar transistor element 70 is the $P^{TH}$ non-inverting output PNIO (not shown), and a $P^{TH}$ collector of the $P^{TH}$ NPN bipolar transistor element 70 is the $P^{TH}$ inverting output PINO (not shown).

The first transistor bias circuit 20 includes the first bias circuit 32 having the first bias output FBOUT, the first ballast resistive element 34, a second ballast resistive element 72, and up to and including a $P^{TH}$ ballast resistive element 74. Further, the first transistor bias circuit 20 includes the first series resistive element 36, a second series resistive element 76, and up to and including a $P^{TH}$ series resistive element 78. The first bias circuit 32 is coupled to ground and receives the DC supply signal 26 to provide an appropriate DC bias voltage at the first bias output FBOUT. The first ballast resistive element 34 is coupled between the first bias output FBOUT and the first base of the first NPN bipolar transistor element 30. The second ballast resistive element 72 is coupled between the first bias output FBOUT and the second base of the second NPN bipolar transistor element 68. The $P^{TH}$ ballast resistive element 74 is coupled between the first bias output FBOUT and the $P^{TH}$ base of the $P^{TH}$ NPN bipolar transistor element 70.

The first series resistive element 36 is coupled to the first base of the first NPN bipolar transistor element 30 and receives the first RF input signal 14 (not shown). The second series resistive element 76 is coupled to the second base of the second NPN bipolar transistor element 68 and receives the first RF input signal 14 (not shown). The $P^{TH}$ series resistive element 78 is coupled to the $P^{TH}$ base of the $P^{TH}$ NPN bipolar transistor element 70 and receives the first RF input signal 14 (not shown). The first DC bias may be provided to the first input FINP of the first transistor element 18 by the first bias output FBOUT of the first bias circuit 32 through the first ballast resistive element 34, by the first series resistive element 36, or both. Therefore, the first DC bias may be based on the first bias circuit 32 and the first ballast resistive element 34, on the first series resistive element 36, or both.

A second DC bias may be provided to the second input SINP of the second transistor element 64 by the first bias output FBOUT of the first bias circuit 32 through the second ballast resistive element 72, by the second series resistive element 76, or both. Therefore, the second DC bias may be based on the first bias circuit 32 and the second ballast resistive element 72, on the second series resistive element 76, or both. A $P^{TH}$ DC bias may be provided to the $P^{TH}$ input PINP of the $P^{TH}$ transistor element 66 by the first bias output FBOUT of the first bias circuit 32 through the $P^{TH}$ ballast resistive element 74, by the $P^{TH}$ series resistive element 78, or both. Therefore, the $P^{TH}$ DC bias may be based on the first bias circuit 32 and the $P^{TH}$ ballast resistive element 74, on the $P^{TH}$ series resistive element 78, or both.

Each of the transistor elements 18, 64, 66 may operate as either a Class AB amplifier or as a Class B amplifier based on a magnitude of the first RF output power. The first transistor bias circuit 20 controls transitioning between operating as the Class AB amplifier and operating as the Class B amplifier. When the magnitude of the first RF output power is below the first threshold 40, each of the transistor elements 18, 64, 66 operates as the Class AB amplifier, and when the magnitude of the RF output power is above the first threshold 40, each of the transistor elements 18, 64, 66 operates as the Class B amplifier. By coupling resistive elements between the bases of the bipolar transistor elements 30, 68, 70, bias differentiation may be provided to each of the bipolar transistor elements 30, 68, 70, thereby assuring that each of the bipolar transistor elements 30, 68, 70 has proper DC bias. Further, the bias differentiation may assure that each of the bipolar transistor elements 30, 68, 70 transitions between Class AB operation and Class B operation properly.

Figure 12:
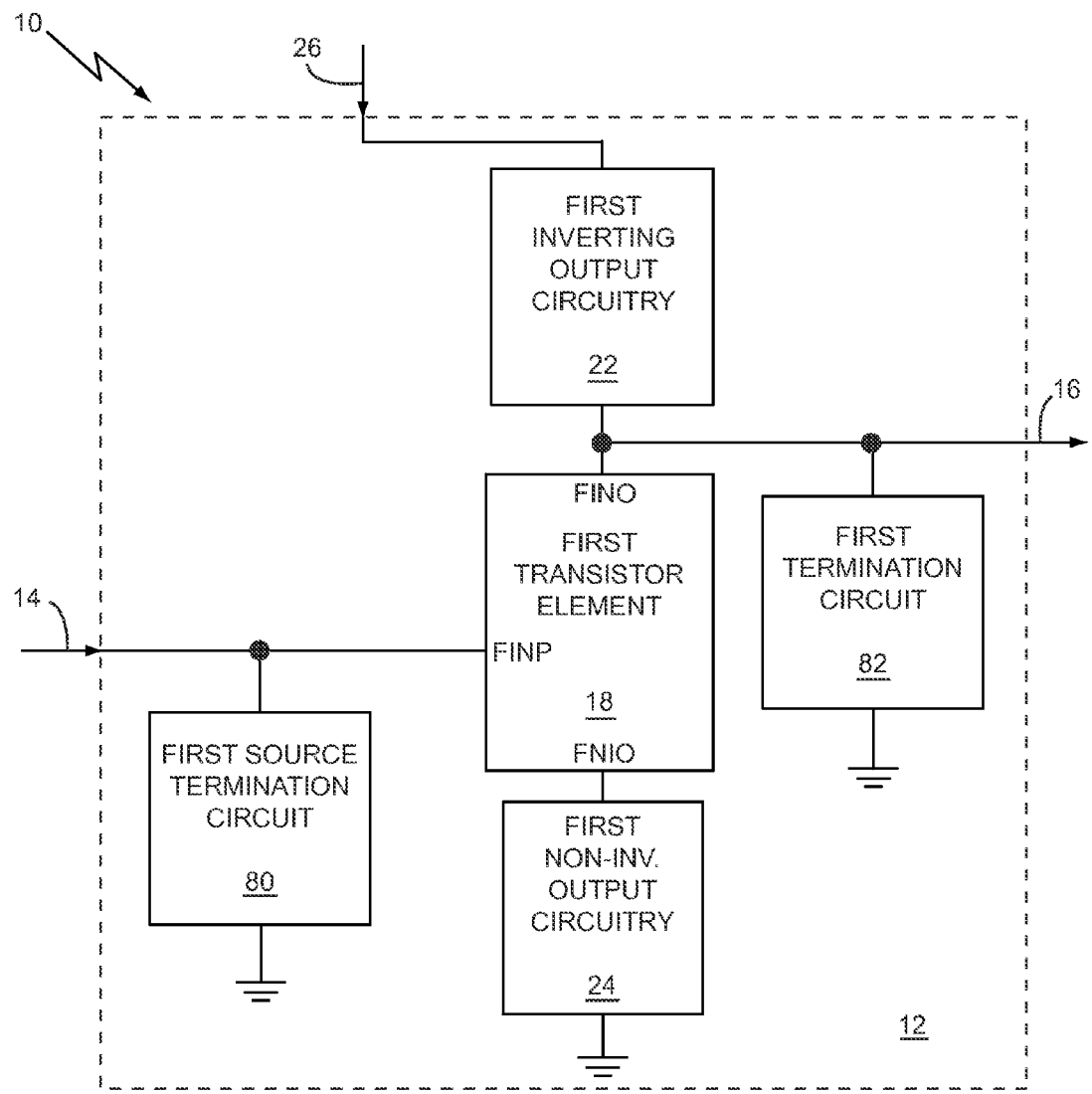
FIG. 12 shows details of the first amplifier stage illustrated in FIG. 1 according to another embodiment of the first amplifier stage.

FIG. 12 shows details of the first amplifier stage 12 illustrated in FIG. 1 according to another embodiment of the first amplifier stage 12. The first amplifier stage 12 includes the first transistor element 18 having the first input FINP, the first inverting output FINO, and the first non-inverting output FNIO. The first amplifier stage 12 further includes the first inverting output circuitry 22, the first non-inverting output circuitry 24, a first source termination circuit 80, and a first load termination circuit 82. The first source termination circuit 80 is coupled between the first input FINP of the first transistor element 18 and ground. The first input FINP receives the first RF input signal 14. The first non-inverting output circuitry 24 is coupled between the first non-inverting output FNIO of the first transistor element 18 and ground. Other embodiments of the first amplifier stage 12 may omit the first non-inverting output circuitry 24, such that the first non-inverting output FNIO is coupled directly to ground, or another DC reference (not shown). The first inverting output circuitry 22 receives the DC supply signal 26 and is coupled to the first inverting output FINO of the first transistor element 18 to provide the first RF output signal 16, which has the first RF output power. The first load termination circuit 82 is coupled between the first inverting output FINO of the first transistor element 18 and ground. Alternate embodiments of the first amplifier stage 12 may omit the first source termination circuit 80, the first load termination circuit 82, or both. The first transistor element 18 amplifies the first RF input signal 14 to provide the first RF output signal 16.

The first source termination circuit 80, the first load termination circuit 82, or both may be used in an unconventional manner to shape first amplitude-based amplitude modulation (AM-AM) distortion, first amplitude-based phase modulation (AM-PM) distortion, or both, to extend a linear operating range of the first transistor element 18. Shaping AM-AM distortion may include reducing the AM-AM distortion, pre-distorting the AM-AM distortion, or both. Similarly, shaping AM-PM distortion may include reducing the AM-PM distortion, pre-distorting the AM-PM distortion, or both. In an exemplary embodiment of the first amplifier stage 12, the linear operating range of the first transistor element 18 is extended by at least one decibel (db). Conventional RF power amplifier circuitry may operate as a Class F RF power amplifier, which may use termination circuits to create impedance valleys at even harmonics of an RF carrier frequency to improve a saturated efficiency of the RF power amplifier circuitry. However, the first termination circuits 80, 82 of the present disclosure may create impedance valleys that are not at even harmonics of an RF carrier frequency to shape amplitude-based distortion, thereby extending a linear operating range of the first transistor element 18. In general, the first termination circuits 80, 82 may be used to rotate impedances, such that the linear operating range of the first transistor element 18 is extended and the impedances of the first termination circuits 80, 82 are relatively high at desired RF operating frequencies.

Figure 13:
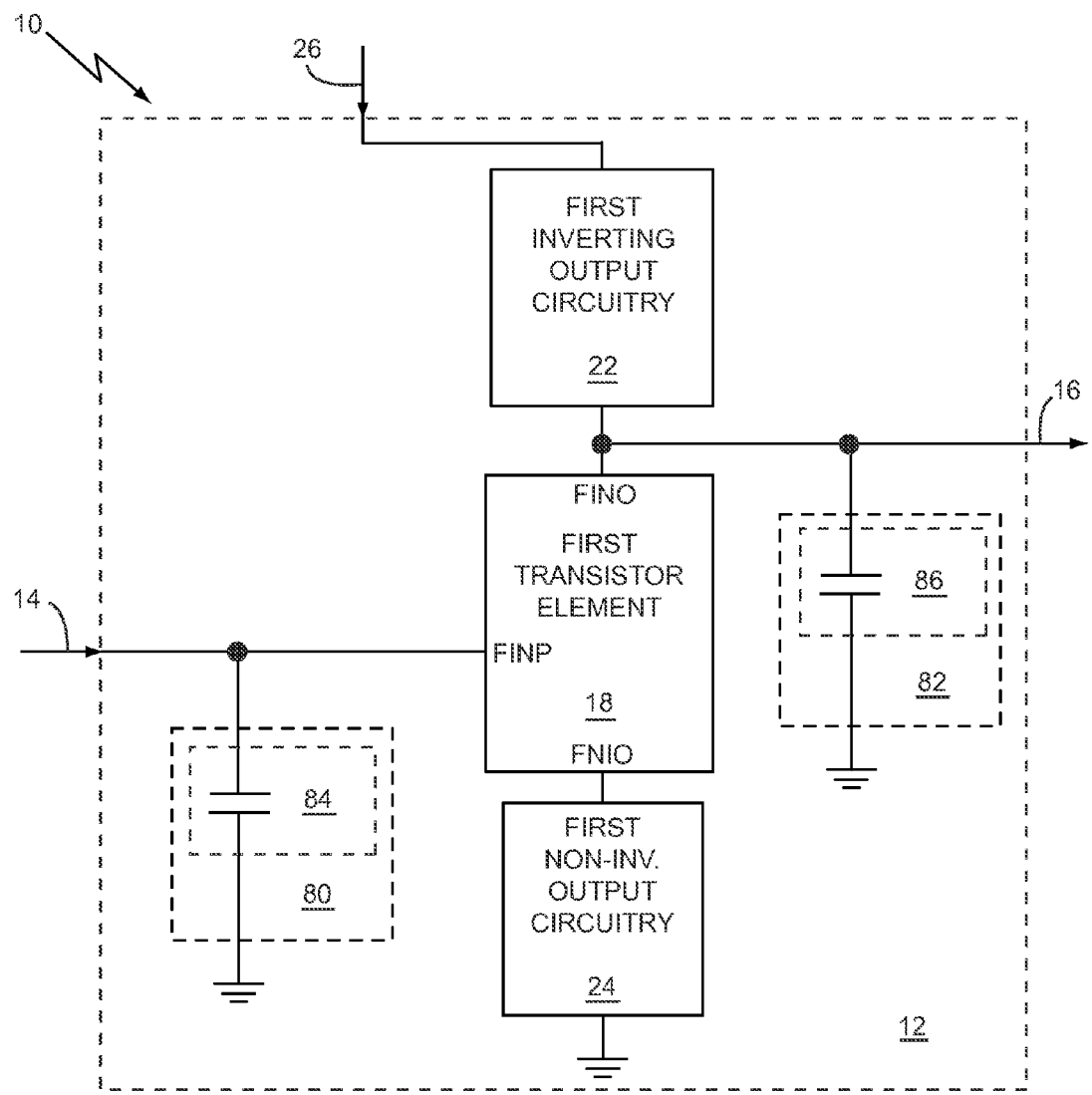
FIG. 13 shows details of a first source termination circuit and a first load termination circuit illustrated in FIG. 12 according to one embodiment of the first source termination circuit and the first load termination circuit.

FIG. 13 shows details of the first source termination circuit 80 and the first load termination circuit 82 illustrated in FIG. 12 according to one embodiment of the first source termination circuit 80 and the first load termination circuit 82. The first source termination circuit 80 includes a first capacitive element 84 coupled between the first input FINP of the first transistor element 18 and ground, and the first load termination circuit 82 includes a second capacitive element 86 coupled between the first inverting output FINO of the first transistor element 18 and ground.

Figure 14A:
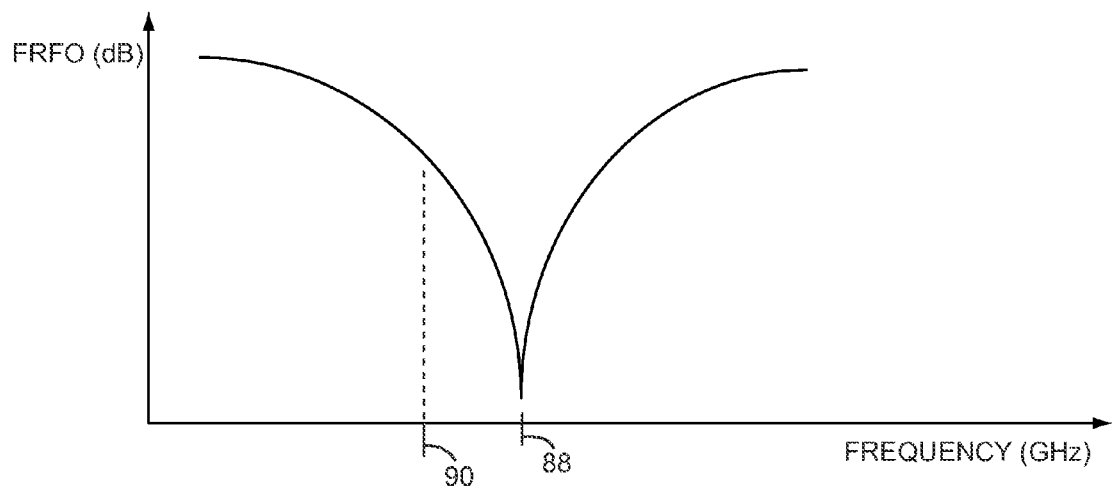
FIG. 14A is a graph illustrating an impedance response associated with the first load termination circuit according to one embodiment of the first load termination circuit.

FIG. 14A is a graph illustrating an impedance response associated with the first load termination circuit 82 according to one embodiment of the first load termination circuit 82. The impedance response illustrated in FIG. 14A shows an impedance across the first load termination circuit 82 over a frequency range of a first carrier frequency of the first RF input signal 14. The impedance response is represented by a magnitude of the first RF output signal 16 (FRFO). The impedance response has a first impedance valley 88 at a frequency that is not coincident with a second harmonic 90 of the first carrier frequency.

Figure 14B:
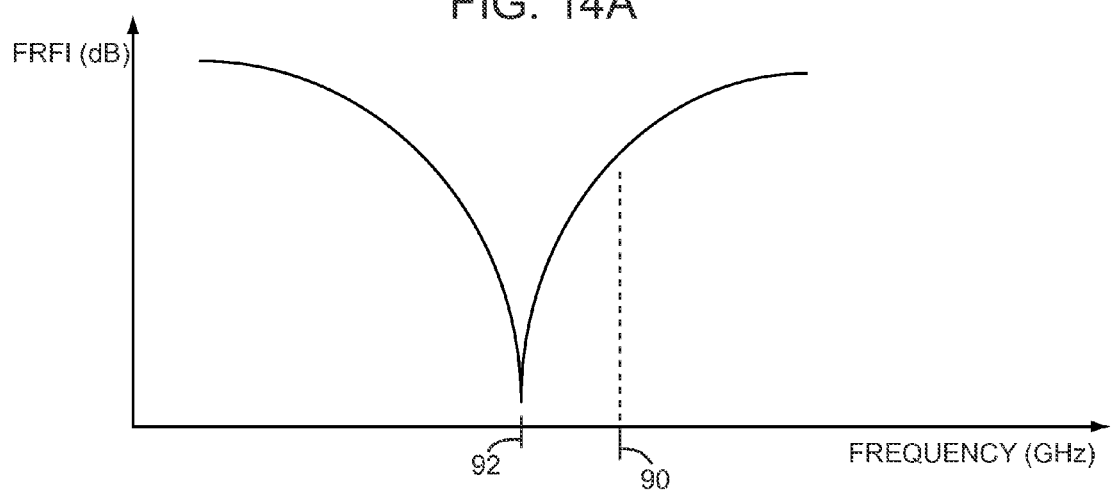
FIG. 14B is a graph illustrating an impedance response associated with the first source termination circuit according to one embodiment of the first source termination circuit.

FIG. 14B is a graph illustrating an impedance response associated with the first source termination circuit 80 according to one embodiment of the first source termination circuit 80. The impedance response illustrated in FIG. 14B shows an impedance across the first source termination circuit 80 over a frequency range of the first carrier frequency of the first RF input signal 14. The impedance response is represented by a magnitude of the first RF input signal 14 (FRFI). The impedance response has a second impedance valley 92 at a frequency that is not coincident with the second harmonic 90 of the first carrier frequency. The first amplifier stage 12 may not operate as a Class F amplifier.

Figure 15:
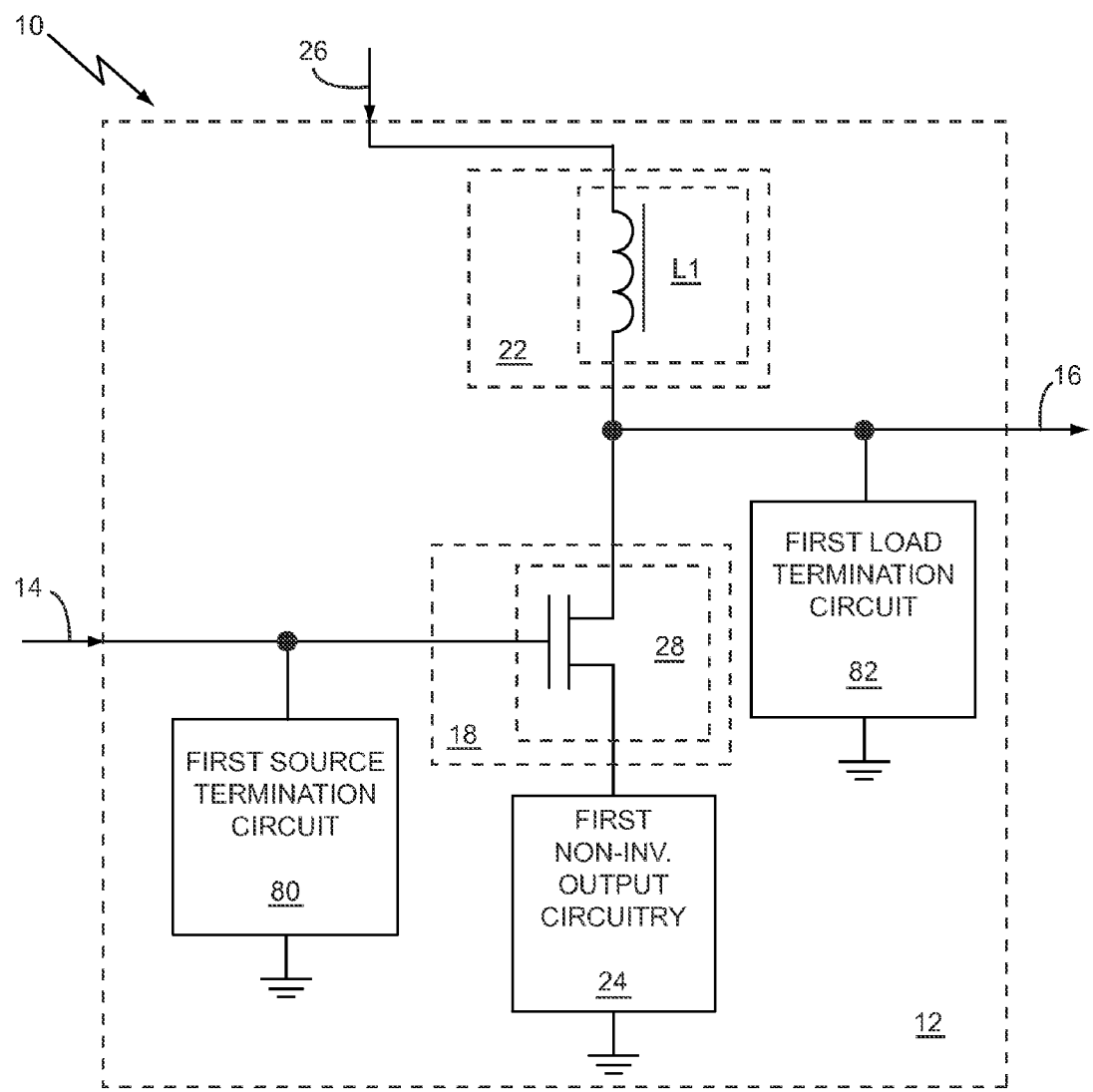
FIG. 15 shows details of a first transistor element and first inverting output circuitry illustrated in FIG. 12 according to one embodiment of the first transistor element and the first inverting output circuitry.

FIG. 15 shows details of the first transistor element 18 and the first inverting output circuitry 22 illustrated in FIG. 12 according to one embodiment of the first transistor element 18 and the first inverting output circuitry 22. The first inverting output circuitry 22 includes the first inductive element L1, which is coupled to the first inverting output FINO (not shown) of the first transistor element 18 to provide the first RF output signal 16, and receives the DC supply signal 26. The first transistor element 18 includes the first N-FET element 28, such that the first gate of the first N-FET element 28 is the first input FINP (not shown), the first source of the first N-FET element 28 is the first non-inverting output FNIO (not shown), and the first drain of the first N-FET element 28 is the first inverting output FINO (not shown). The first drain of the first N-FET element 28 is coupled to the first inductive element L1 to provide the first RF output signal 16. The first inductive element L1 may be used to isolate the first RF output signal 16 from the DC supply signal 26.

Figure 16:
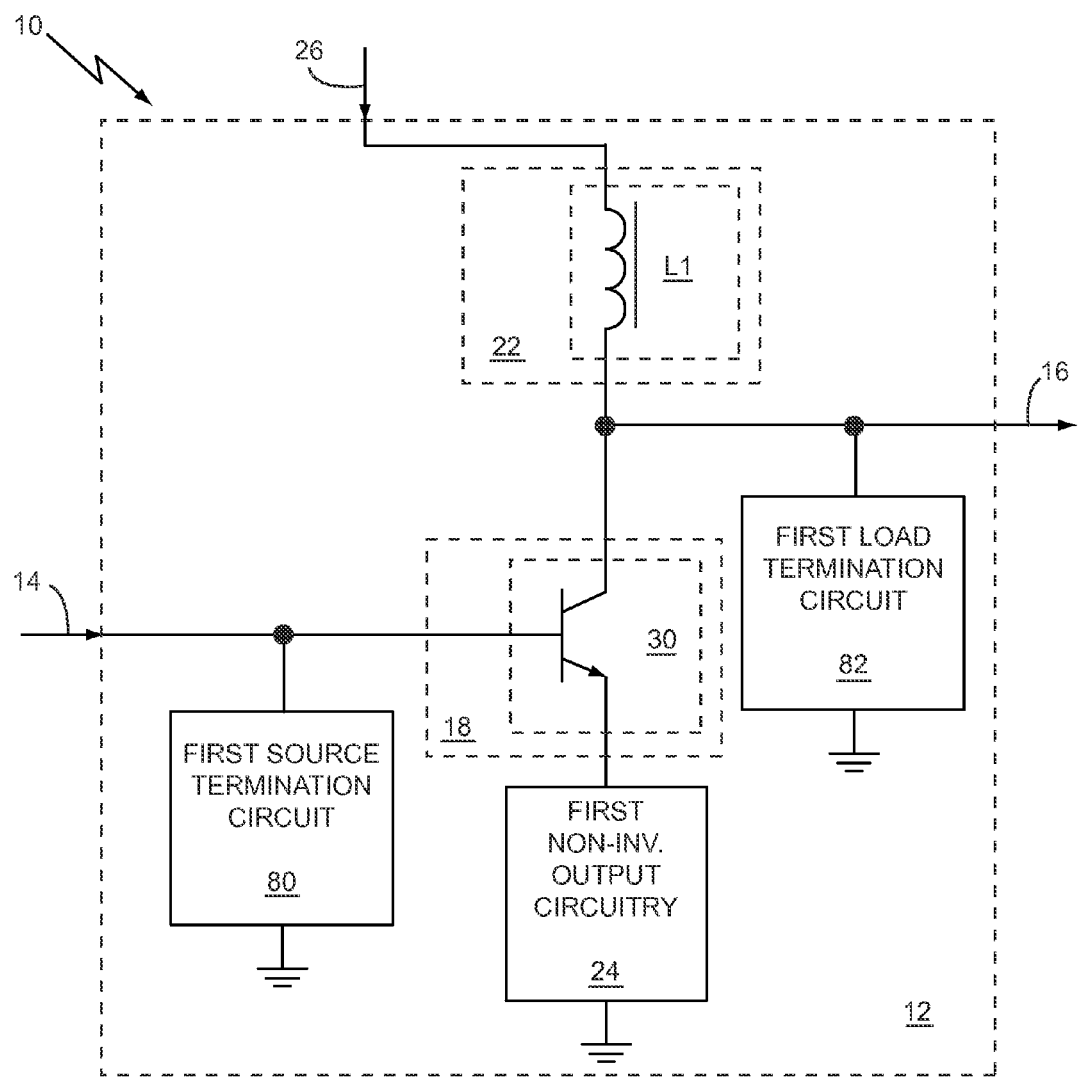
FIG. 16 shows details of the first transistor element and the first inverting output circuitry illustrated in FIG. 12 according to an alternate embodiment of the first transistor element and the first inverting output circuitry.

FIG. 16 shows details of the first transistor element 18 and the first inverting output circuitry 22 illustrated in FIG. 12 according to an alternate embodiment of the first transistor element 18 and the first inverting output circuitry 22. The first inverting output circuitry 22 includes the first inductive element L1, which is coupled to the first inverting output FINO (not shown) of the first transistor element 18 to provide the first RF output signal 16, and receives the DC supply signal 26. The first transistor element 18 includes the first NPN bipolar transistor element 30, such that the first base of the first NPN bipolar transistor element 30 is the first input FINP (not shown), the first emitter of the first NPN bipolar transistor element 30 is the first non-inverting output FNIO (not shown), and the first collector of the first NPN bipolar transistor element 30 is the first inverting output FINO (not shown). The first collector of the first NPN bipolar transistor element 30 is coupled to the first inductive element L1 to provide the first RF output signal 16. The first inductive element L1 may be used to isolate the first RF output signal 16 from the DC supply signal 26. In an exemplary embodiment of the first transistor element 18, the first transistor element 18 is a first bipolar transistor element, such as the first NPN bipolar transistor element 30. In an exemplary embodiment of the first bipolar transistor element, the first bipolar transistor element is a first HBT element.

FIG. 17 shows the RF power amplifier circuitry 10 using multiple amplifier stages to form a multi-stage RF power amplifier according to an alternate embodiment of the RF power amplifier circuitry 10. The RF power amplifier circuitry 10 includes the first amplifier stage 12, which receives and amplifies the first RF input signal 14 to provide the first RF output signal 16 having the first RF output power, a second amplifier stage 94, which receives and amplifies the first RF output signal 16 to provide a second RF output signal 96 having a second RF output power, and up to and including at least one supplemental amplifier stage 98, which receives and amplifies the second RF output signal 96 to provide a supplemental RF output signal 100 having a supplemental RF output power.

In one embodiment of the RF power amplifier circuitry 10, the at least one supplemental amplifier stage 98 may be omitted, such that the multi-stage RF power amplifier includes the first and the second amplifier stages 12, 94. The first amplifier stage 12 may have first AM-AM distortion, first AM-PM distortion, or both. Similarly, the second amplifier stage 94 may have second AM-AM distortion, second AM-PM distortion, or both. The second AM-AM distortion and the second AM-PM distortion may be used to at least partially compensate for the first AM-AM distortion and the first AM-PM distortion to extend a linear operating range of the multi-stage RF power amplifier. The first AM-AM distortion, the first AM-PM distortion, the second AM-AM distortion, the second AM-PM distortion, or any combination thereof may be used to increase a resistive load line of the multi-stage RF power amplifier. In an exemplary embodiment of the multi-stage RF power amplifier, the increase of the resistive load line is from less than about five ohms to greater than about six ohms.

Figure 18:
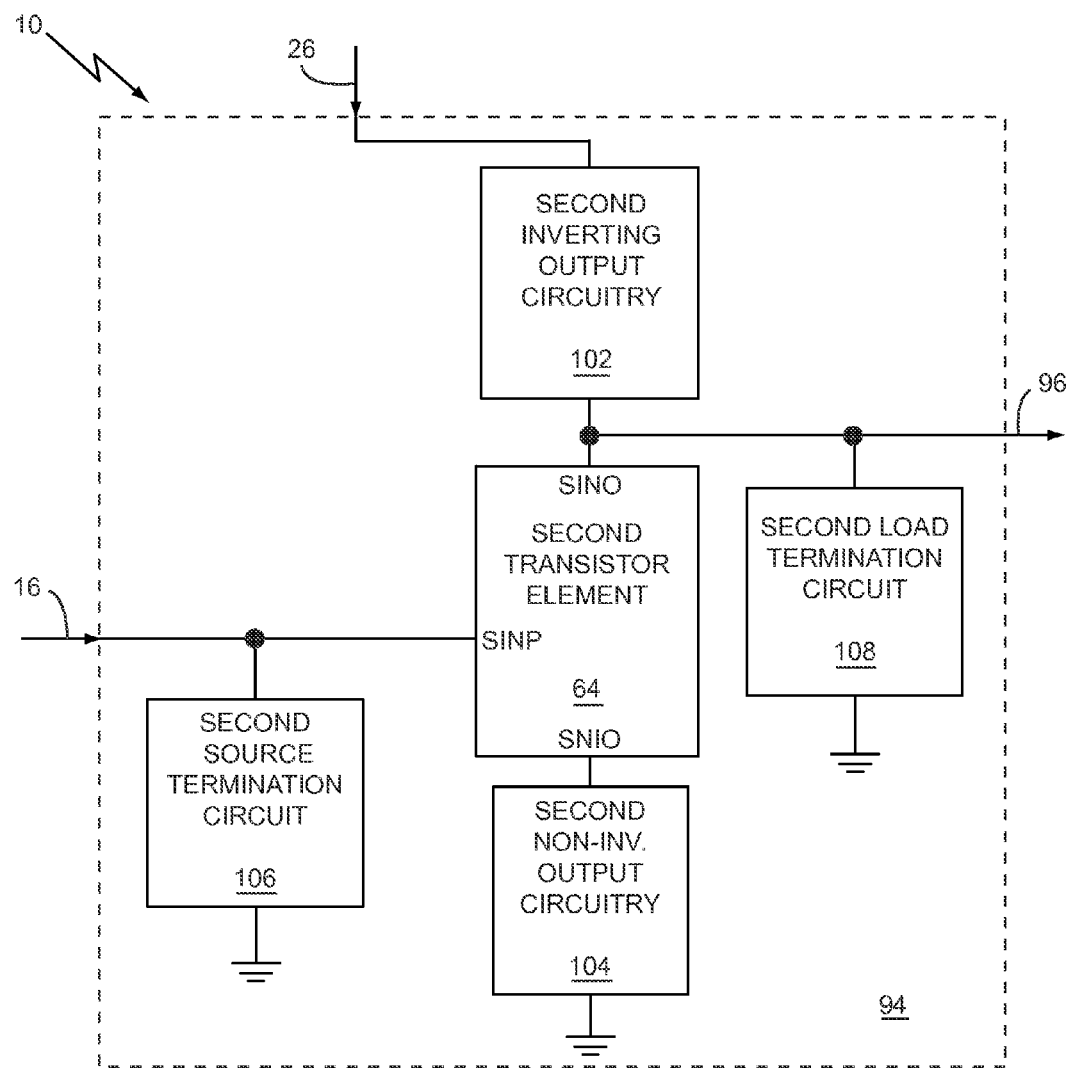
FIG. 18 shows details of a second amplifier stage illustrated in FIG. 17 according to one embodiment of the second amplifier stage.

FIG. 18 shows details of the second amplifier stage 94 illustrated in FIG. 17 according to one embodiment of the second amplifier stage 94. The second amplifier stage 94 includes the second transistor element 64 having the second input SINP, the second inverting output SINO, and the second non-inverting output SNIO. The second amplifier stage 94 further includes second inverting output circuitry 102, second non-inverting output circuitry 104, a second source termination circuit 106, and a second load termination circuit 108. The second source termination circuit 106 is coupled between the second input SINP of the second transistor element 64 and ground. The second input SINP receives the first RF output signal 16. The second non-inverting output circuitry 104 is coupled between the second non-inverting output SNIO of the second transistor element 64 and ground. Other embodiments of the second amplifier stage 94 may omit the second non-inverting output circuitry 104, such that the second non-inverting output SNIO is coupled directly to ground, or another DC reference (not shown). The second inverting output circuitry 102 receives the DC supply signal 26 and is coupled to the second inverting output SINO of the second transistor element 64 to provide the second RF output signal 96, which has the second RF output power. The second load termination circuit 108 is coupled between the second inverting output SINO of the second transistor element 64 and ground. Alternate embodiments of the second amplifier stage 94 may omit the second source termination circuit 106, the second load termination circuit 108, or both. The second transistor element 64 amplifies the first RF output signal 16 to provide the second RF output signal 96.

The second source termination circuit 106, the second load termination circuit 108, or both may be used in an unconventional manner to shape second the AM-AM distortion, the second AM-PM distortion, or both, to extend a linear operating range of the second transistor element 64. Shaping AM-AM distortion may include reducing the AM-AM distortion, pre-distorting the AM-AM distortion, or both. Similarly, shaping AM-PM distortion may include reducing the AM-PM distortion, pre-distorting the AM-PM distortion, or both. In an exemplary embodiment of the second amplifier stage 94, the linear operating range of the second transistor element 64 is extended by at least one db. Conventional RF power amplifier circuitry may operate as a Class F RF power amplifier, which may use termination circuits to create impedance valleys at even harmonics of an RF carrier frequency to improve a saturated efficiency of the RF power amplifier circuitry. However, the second termination circuits 106, 108 of the present disclosure may create impedance valleys that are not at even harmonics of an RF carrier frequency to shape amplitude-based distortion, thereby extending a linear operating range of the second transistor element 64. In general, the second termination circuits 106, 108 may be used to rotate impedances, such that the linear operating range of the second transistor element 64 is extended and the impedances of the second termination circuits 106, 108 are relatively high at desired RF operating frequencies.

When the first amplifier stage 12 and the second amplifier stage 94 are used in the multi-stage RF power amplifier, the shaped second AM-AM distortion, the shaped second AM-PM distortion, or both may be used to at least partially compensate for the first AM-AM distortion, the first AM-PM distortion, or both to extend the linear operating range of the multi-stage RF power amplifier. In one embodiment of the multi-stage RF power amplifier, the first load termination circuit 82 and the second source termination circuit 106 are provided by a combined termination circuit (not shown).

FIGS. 19A, 19B, and 19C are graphs illustrating comparative linearities of the first amplifier stage 12 operating in isolation, the second amplifier stage 94 operating in isolation, and the combination of the first and the second amplifier stages 12, 94 operating as a multi-stage RF power amplifier, respectively, according to one embodiment of the first and the second amplifier stages 12, 94. FIG. 19A illustrates how a first ACPR associated with the first amplifier stage 12 operating in isolation varies with the first RF output power. FIG. 19B illustrates how a second ACPR associated with the second amplifier stage 94 operating in isolation varies with the second RF output power. FIG. 19C illustrates how a combined ACPR associated with the first and the second amplifier stages 12, 94 operating in tandem as the multi-stage RF power amplifier varies with the second RF output power. As seen in the graphs, the first ACPR and the second ACPR may tend to compensate for one another, particularly at less than maximum output power levels. Specifics of any or all of the termination circuits 80, 82, 106, 108 may be chosen to provide desired first AM-AM distortion, first AM-PM distortion, second AM-AM distortion, second AM-PM distortion, or any combination thereof to produce the results illustrated in FIGS. 19A-19C.

FIG. 20 shows details of the first amplifier stage 12 illustrated in FIG. 1 and FIG. 17 according to an alternate embodiment of the first amplifier stage 12. The first amplifier stage 12 illustrated in FIG. 20 combines the first transistor bias circuit 20, which is illustrated in FIG. 2, with the first termination circuits 80, 82, which are illustrated in FIG. 12. The first transistor bias circuit 20 is coupled between the first source termination circuit 80 and the first input FINP of the first transistor element 18. Further, the first transistor bias circuit 20 receives the first RF input signal 14. By combining the first transistor bias circuit 20 and the first termination circuits 80, 82, the first amplifier stage 12 may benefit from both the power added operating efficiency benefits associated with the first transistor bias circuit 20 and the extension of the linear operating range of the first transistor element 18 benefits associated with the first termination circuits 80, 82 previously mentioned. Alternate embodiments of the first amplifier stage 12 may omit the first source termination circuit 80, the first load termination circuit 82, or both. Further, synergistic benefits may be realized by combining the first transistor bias circuit 20 and the first termination circuits 80, 82. For example, the power added operating efficiency may be further increased, the linear operating range of the first transistor element 18 may be further extended, or both.

FIG. 21 shows details of the second amplifier stage 94 illustrated in FIG. 17 according to one embodiment of the second amplifier stage 94. The second amplifier stage 94 illustrated in FIG. 21 may be similar to and realize similar benefits to the first amplifier stage 12 illustrated in FIG. 20. The second amplifier stage 94 illustrated in FIG. 21 combines a second transistor bias circuit 110 with the second termination circuits 106, 108, which are illustrated in FIG. 18. The second transistor bias circuit 110 may be similar to the first transistor bias circuit 20 and is coupled between the second source termination circuit 106 and the second input SINP of the second transistor element 64. Further, the second transistor bias circuit 110 receives the first RF output signal 16. By combining the second transistor bias circuit 110 and the second termination circuits 106, 108, the second amplifier stage 94 may benefit from both the power added operating efficiency benefits associated with the first transistor bias circuit 20 and the extension of the linear operating range of the second transistor element 64 benefits associated with the second termination circuits 106, 108 previously mentioned. Alternate embodiments of the second amplifier stage 94 may omit the second source termination circuit 106, the second load termination circuit 108, or both. Further, synergistic benefits may be realized by combining the second transistor bias circuit 110 and the second termination circuits 106, 108. For example, the power added operating efficiency may be further increased, the linear operating range of the second transistor element 64 may be further extended, or both.

FIG. 22 shows details of the first transistor bias circuit 20 illustrated in FIG. 20 according to one embodiment of the first transistor bias circuit 20. The first transistor bias circuit 20 includes the first bias circuit 32 having the first bias output FBOUT, the first ballast resistive element 34, and the first series resistive element 36. The first bias circuit 32 is coupled to ground and receives the DC supply signal 26 to provide an appropriate DC bias voltage at the first bias output FBOUT. The first ballast resistive element 34 is coupled between the first bias output FBOUT and the first input FINP of the first transistor element 18. The first series resistive element 36 is coupled between the first input FINP of the first transistor element 18 and the first source termination circuit 80 and receives the first RF input signal 14. The first DC bias may be provided to the first input FINP of the first transistor element 18 by the first bias output FBOUT of the first bias circuit 32 through the first ballast resistive element 34, by the first series resistive element 36, or both. Therefore, the first DC bias may be based on the first bias circuit 32 and the first ballast resistive element 34, on the first series resistive element 36, or both.

FIG. 23 shows details of the second transistor bias circuit 110 illustrated in FIG. 21 according to one embodiment of the second transistor bias circuit 110. The second transistor bias circuit 110 includes a second bias circuit 112 having a second bias output SBOUT, the second ballast resistive element 72, and the second series resistive element 76. The second bias circuit 112 is coupled to ground and receives the DC supply signal 26 to provide an appropriate DC bias voltage at the second bias output SBOUT. The second ballast resistive element 72 is coupled between the second bias output SBOUT and the second input SINP of the second transistor element 64. The second series resistive element 76 is coupled between the second input SINP and the second source termination circuit 106 and receives the first RF output signal 16. The second DC bias may be provided to the second input SINP of the second transistor element 64 by the second bias output SBOUT of the second bias circuit 112 through the second ballast resistive element 72, by the second series resistive element 76, or both. Therefore, the second DC bias may be based on the second bias circuit 112 and the second ballast resistive element 72, on the second series resistive element 76, or both.

An application example of the RF power amplifier circuitry 10 is its use in a mobile terminal 114, the basic architecture of which is represented in FIG. 24. The mobile terminal 114 may include a receiver front end 116, a radio frequency transmitter section 118, an antenna 120, a duplexer or switch 122, a baseband processor 124, a control system 126, a frequency synthesizer 128, and an interface 130. The receiver front end 116 receives information bearing radio frequency signals from one or more remote transmitters provided by a base station (not shown). A low noise amplifier (LNA) 132 amplifies the signal. A filter circuit 134 minimizes broadband interference in the received signal, while down conversion and digitization circuitry 136 down converts the filtered, received signal to an intermediate or baseband frequency signal, which is then digitized into one or more digital streams. The receiver front end 116 typically uses one or more mixing frequencies generated by the frequency synthesizer 128. The baseband processor 124 processes the digitized received signal to extract the information or data bits conveyed in the received signal. This processing typically comprises demodulation, decoding, and error correction operations. As such, the baseband processor 124 is generally implemented in one or more digital signal processors (DSPs).

On the transmit side, the baseband processor 124 receives digitized data, which may represent voice, data, or control information, from the control system 126, which it encodes for transmission. The encoded data is output to the transmitter 118, where it is used by a modulator 138 to modulate a carrier signal that is at a desired transmit frequency. The RF power amplifier circuitry 10 amplifies the modulated carrier signal to a level appropriate for transmission, and delivers the amplified and modulated carrier signal to the antenna 120 through the duplexer or switch 122.

A user may interact with the mobile terminal 114 via the interface 130, which may include interface circuitry 140 associated with a microphone 142, a speaker 144, a keypad 146, and a display 148. The interface circuitry 140 typically includes analog-to-digital converters, digital-to-analog converters, amplifiers, and the like. Additionally, it may include a voice encoder/decoder, in which case it may communicate directly with the baseband processor 124. The microphone 142 will typically convert audio input, such as the user's voice, into an electrical signal, which is then digitized and passed directly or indirectly to the baseband processor 124. Audio information encoded in the received signal is recovered by the baseband processor 124, and converted by the interface circuitry 140 into an analog signal suitable for driving the speaker 144. The keypad 146 and display 148 enable the user to interact with the mobile terminal 114, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) power amplifier circuitry comprising:
    a first transistor element adapted to amplify a first RF input signal to provide a first RF output signal from a first inverting output of the first transistor element; and
    a first load termination circuit coupled to the first inverting output and adapted to shape first amplitude-based amplitude modulation (AM-AM) distortion and first amplitude-based phase modulation (AM-PM) distortion to extend a linear operating range of the first transistor element,
    the first transistor element and the first load termination circuit form a first amplifier stage adapted to receive the first RF input signal, wherein the first RF input signal has a first carrier frequency; and
    a first impedance valley associated with the first load termination circuit is not coincident with a second harmonic of the first carrier frequency.

2. The RF power amplifier circuitry of claim 1 further comprising a first source termination circuit coupled to a first input of the first transistor element and adapted to further shape the first AM-AM distortion and the first AM-PM distortion to further extend the linear operating range of the first transistor element, wherein the first transistor element, the first load termination circuit, and the first source termination circuit form the first amplifier stage.

3. The RF power amplifier circuitry of claim 2 wherein the linear operating range of the first transistor element is extended by at least one dBm.

4. The RF power amplifier circuitry of claim 2 wherein:
    a second impedance valley associated with the first source termination circuit is not coincident with the second harmonic of the first carrier frequency; and
    the first amplifier stage does not operate as a class F amplifier.

5. The RF power amplifier circuitry of claim 2 wherein:
    the first transistor element comprises a first field effect transistor (FET) element;
    the first inverting output is a drain of the first FET element; and
    the first input is a gate of the first FET element.

6. The RF power amplifier circuitry of claim 2 wherein:
    the first transistor element comprises a first bipolar transistor element;
    the first inverting output is a collector of the first bipolar transistor element; and
    the first input is a base of the first bipolar transistor element.

7. The RF power amplifier circuitry of claim 6 wherein the first bipolar transistor element comprises a first heterojunction bipolar transistor (HBT) element.

8. The RF power amplifier circuitry of claim 2 wherein:
    the first source termination circuit comprises a first capacitive element; and
    the first load termination circuit comprises a second capacitive element.

9. The RF power amplifier circuitry of claim 2:
    further comprising a first transistor bias circuit coupled between the first input of the first transistor element and the first source termination circuit and adapted to provide a first direct current (DC) bias to the first input and receive the first RF input signal; and
    the first transistor element is further adapted to:
        when a magnitude of the first RF output signal is above a first threshold, operate as a class B amplifier based on the first transistor bias circuit; and
        when the magnitude of the first RF output signal is below the first threshold, operate as a class AB amplifier based on the first transistor bias circuit,
    wherein the first transistor element, the first load termination circuit, and the first transistor bias circuit form the first amplifier stage adapted to receive the first RF input signal.

10. The RF power amplifier circuitry of claim 1 further comprising:

a second transistor element adapted to amplify the first RF output signal to provide a second RF output signal from a second inverting output of the second transistor element; and a second load termination circuit coupled to the second inverting output and adapted to shape second AM-AM distortion and second AM-PM distortion, such that:

the second transistor element and the second load termination circuit form a second amplifier stage;

the first amplifier stage and the second amplifier stage form a multi-stage RF power amplifier, which is adapted to receive the first RF input signal; and the shaped second AM-AM distortion and second AM-PM distortion at least partially compensate for the first AM-AM distortion and the first AM-PM distortion to extend a linear operating range of the multi-stage RF power amplifier.

11. The RF power amplifier circuitry of claim 10 further comprising at least one supplemental amplifier stage adapted to receive and amplify the second RF output signal to provide a supplemental RF output signal.

12. The RF power amplifier circuitry of claim 10 wherein the first AM-AM distortion, the second AM-AM distortion, the first AM-PM distortion, and the second AM-PM distortion increase a resistive load line of the multi-stage RF power amplifier.

13. The RF power amplifier circuitry of claim 12 wherein the increase of the resistive load line is from less than about five ohms to greater than about six ohms.

14. The RF power amplifier circuitry of claim 10 wherein the first amplifier stage further comprises a first source termination circuit coupled to a first input of the first transistor element and adapted to further shape the first AM-AM distortion and the first AM-PM distortion.

15. The RF power amplifier circuitry of claim 14 wherein the second amplifier stage further comprises a second source termination circuit coupled to a second input of the second transistor element and adapted to further shape the second AM-AM distortion and the second AM-PM distortion.

16. The RF power amplifier circuitry of claim 15 wherein the first load termination circuit and the second source termination circuit are provided by a combined termination circuit.

17. The RF power amplifier circuitry of claim 15: further comprising:

a first transistor bias circuit coupled between the first input of the first transistor element and the first source termination circuit and adapted to provide a first direct current (DC) bias to the first input and receive the first RF input signal; and a second transistor bias circuit coupled between the second input of the second transistor element and the second source termination circuit and adapted to provide a second DC bias to the second input and receive the first RF output signal;

the first transistor element is further adapted to:

when a magnitude of the first RF output signal is above a first threshold, operate as a class B amplifier based on the first transistor bias circuit; and when the magnitude of the first RF output signal is below the first threshold, operate as a class AB amplifier based on the first transistor bias circuit;

the second transistor element is further adapted to:

when a magnitude of the second RF output power is above a second threshold, operate as a class B amplifier based on the second transistor bias circuit; and when the magnitude of the second RF output power is below the second threshold, operate as a class AB amplifier based on the second transistor bias circuit;

the first transistor element, the first load termination circuit, and the first transistor bias circuit form the first amplifier stage; and the second transistor element, the second load termination circuit, and the second transistor bias circuit form the second first amplifier stage.

18. The RF power amplifier circuitry of claim 17 wherein:

the first transistor bias circuit comprises a first bias circuit and a first ballast resistive element, which is coupled between the first bias circuit and the first input of the first transistor element, such that:

the first DC bias is based on the first bias circuit and the first ballast resistive element;

when the magnitude of the first RF output signal is above the first threshold, the first transistor element is adapted to operate as the class B amplifier further based on the first ballast resistive element; and when the magnitude of the first RF output signal is below the first threshold, the first transistor element is adapted to operate as the class AB amplifier further based on the first ballast resistive element; and the second transistor bias circuit comprises a second bias circuit and a second ballast resistive element, which is coupled between the second bias circuit and the second input of the second transistor element, such that:

the second DC bias is based on the second bias circuit and the second ballast resistive element;

when the magnitude of the second RF output signal is above the second threshold, the second transistor element is adapted to operate as the class B amplifier further based on the second ballast resistive element; and when the magnitude of the second RF output signal is below the second threshold, the second transistor element is adapted to operate as the class AB amplifier further based on the second ballast resistive element.

19. The RF power amplifier circuitry of claim 18 wherein:

the first transistor bias circuit further comprises a first series resistive element coupled between the first input of the first transistor element and the first source termination circuit, such that:

the first DC bias is further based on the first series resistive element;

when the magnitude of the first RF output signal is above the first threshold, the first transistor element is adapted to operate as the class B amplifier further based on the first series resistive element; and when the magnitude of the first RF output signal is below the first threshold, the first transistor element is adapted to operate as the class AB amplifier further based on the first series resistive element; and the second transistor bias circuit further comprises a second series resistive element coupled between the second input of the second transistor element and the second source termination circuit, such that:

the second DC bias is further based on the second series resistive element;

when the magnitude of the second RF output signal is above the second threshold, the second transistor element is adapted to operate as the class B amplifier further based on the second series resistive element; and when the magnitude of the second RF output signal is below the second threshold, the second transistor element is adapted to operate as the class AB amplifier further based on the second series resistive element.

20. A method comprising:
amplifying a first radio frequency (RF) input signal to provide a first RF output signal from a first inverting output of a first transistor element; and
shaping amplitude-based amplitude modulation (AM-AM) distortion and amplitude-based phase modulation (AM-PM) distortion to extend a linear operating range of the first transistor element using a first load termination circuit coupled to the first inverting output,
the first transistor element and the first load termination circuit form a first amplifier stage adapted to receive the first RF input signal; wherein
the first RF input signal has a first carrier frequency; and
a first impedance valley associated with the first load termination circuit is not coincident with a second harmonic of the first carrier frequency.

21. A system comprising:
a first transistor element adapted to amplify a first radio frequency (RF) input signal to provide a first RF output signal from a first inverting output of the first transistor element; and
a first load termination circuit coupled to the first inverting output and adapted to shape first amplitude-based amplitude modulation (AM-AM) distortion to extend a linear operating range of the first transistor element,
wherein
the first transistor element and the first load termination circuit form a first amplifier stage;
the first RF input signal has a first carrier frequency; and
a first impedance valley associated with the first load termination circuit is not coincident with a second harmonic of the first carrier frequency.

* * * * *